US011716864B2

(12) United States Patent
Forrest et al.

(10) Patent No.: US 11,716,864 B2
(45) Date of Patent: Aug. 1, 2023

(54) ORGANIC OPTOELECTRONIC DEVICE

(71) Applicant: The Regents of the University of Michigan, Ann Arbor, MI (US)

(72) Inventors: Stephen R. Forrest, Ann Arbor, MI (US); Caleb Coburn, Citrus Heights, CA (US); Dejiu Fan, Ann Arbor, MI (US)

(73) Assignee: The Regents of the University of Michigan, Ann Arbor, MI (US)

(*) Notice: Subject to any disclaimer, the term of this patent is extended or adjusted under 35 U.S.C. 154(b) by 325 days.

(21) Appl. No.: 16/920,555

(22) Filed: Jul. 3, 2020

(65) Prior Publication Data

US 2021/0028233 A1     Jan. 28, 2021

Related U.S. Application Data

(60) Provisional application No. 62/877,550, filed on Jul. 23, 2019.

(51) Int. Cl.
*H01L 27/146*     (2006.01)
*H10K 39/32*     (2023.01)
(Continued)

(52) U.S. Cl.
CPC ............. *H10K 39/32* (2023.02); *H04N 25/53* (2023.01); *H04N 25/71* (2023.01); *H04N 25/75* (2023.01);
(Continued)

(58) Field of Classification Search
CPC ............... H01L 27/307; H01L 51/0046; H01L 51/4253; H01L 51/442; H01L 51/4246;
(Continued)

(56) References Cited

U.S. PATENT DOCUMENTS

2005/0275056 A1*  12/2005  Forrest .................. H10K 10/00
                                                                     257/499
2013/0200336 A1*  8/2013  Vaidyanathan ...... H10K 85/113
                                                                     257/E51.025

(Continued)

FOREIGN PATENT DOCUMENTS

JP          2020188231 A  * 11/2020  ........... H01L 27/307

OTHER PUBLICATIONS

Amelio, G. F.; Tompsett, M. F.; Smith, G. E., Experimental Verification of Charge Coupled Device Concept. AT&T Tech J 1970, 49, 593.

(Continued)

*Primary Examiner* — Samuel Park
(74) *Attorney, Agent, or Firm* — Riverside Law LLP

(57) ABSTRACT

An organic optoelectronic device comprises a substrate having first and second regions, a first electrode positioned over the first region of the substrate, a shutter electrode positioned over the second region of the substrate, an organic heterojunction layer comprising an organic heterojunction material, positioned over at least a portion of the first electrode, an insulator layer positioned over at least a portion of the shutter electrode, an organic channel layer, comprising an organic channel material, positioned over at least a portion of the heterojunction and insulator layers, and a second electrode positioned over the channel layer in the second region of the substrate, wherein the shutter electrode is configured to generate a repulsive potential barrier in the channel layer, suitable to at least reduce movement of charge in the channel layer. A method of measuring received light in an optoelectronic device is also described.

13 Claims, 19 Drawing Sheets

(51) Int. Cl.
*H04N 25/53* (2023.01)
*H04N 25/71* (2023.01)
*H04N 25/75* (2023.01)
*H10K 30/30* (2023.01)
*H10K 30/82* (2023.01)
*H10K 85/20* (2023.01)

(52) U.S. Cl.
CPC ............. *H10K 30/30* (2023.02); *H10K 30/82* (2023.02); *H10K 85/211* (2023.02)

(58) Field of Classification Search
CPC ........ H04N 5/353; H04N 5/372; H04N 5/378; Y02E 10/549
See application file for complete search history.

(56) References Cited

U.S. PATENT DOCUMENTS

2021/0288092 A1* 9/2021 Watanabe ......... H01L 27/14612
2022/0231246 A1* 7/2022 Murakami ............ H01L 51/441

OTHER PUBLICATIONS

Armin, A.; Jansen-van Vuuren, R. D.; Kopidakis, N.; Burn, P. L.; Meredith, P., Narrowband light detection via internal quantum efficiency manipulation of organic photodiodes. Nat Commun 2015, 6.

Baumann, A.; Lorrmann, J.; Rauh, D.; Deibel, C.; Dyakonov, V., A New Approach for Probing the Mobility and Lifetime of Photogenerated Charge Carriers in Organic Solar Cells Under Real Operating Conditions. Adv Mater 2012, 24, 4381-4386.

Boyle, W. S.; Smith, G. E., Charge Coupled Semiconductor Devices. AT&T Tech J 1970, 49, 587-593.

Burlingame et al., "Centimetre-scale electron diffusion in photoactive organic heterostructures", Nature vol. 554, pp. 77-80 (2018) Jan. 18, 2018; [online] <https://www.nature.com/articles/nature25148 > 8 pages.

Cardinaletti, I.; Vangerven, T.; Nagels, S.; Cornelissen, R.; Schreurs, D.; Hruby, J.; Vodnik, J.; Devisscher, D.; Kesters, J.; D'Haen, J.; Franquet, A.; Spampinato, V.; Conard, T.; Maes, W.; Deferme, W.; Manca, J. V., Organic and perovskite solar cells for space applications. Solar Energy Materials and Solar Cells 2018, 182, 121-127.

Carnes, J. E.; Kosonocky, W. F.; Ramberg, E. G., Drift-Aiding Fringing Fields in Charge-Coupled Devices. IEEE Journal of Solid-State Circuits 1971, Sc 6, 322-326.

Chen, Y.H. et al., "Vacuum-deposited small-molecule organic solar cells with high power conversion efficiencies by judicious molecular design and device optimization," Journal of the American Chemical Society, vol. 134, No. 33, pp. 13616-13623, 2012.

Coburn, C; Fan, D; Forrest, S. R., Organic Charge-Coupled Device. ACS Photonics 2019 6 (8), 2090-2095.

Deledalle, F.; Tuladhar, P. S.; Nelson, J.; Durrant, J. R.; Kirchartz, T., Understanding the Apparent Charge Density Dependence of Mobility and Lifetime in Organic Bulk Heterojunction Solar Cells. J Phys Chem C 2014, 118, 8837-8842.

Dillon, P. L. P.; Lewis, D. M.; Kaspar, F. G., Color Imaging-System Using a Single CCD Area Array. IEEE J. Solid-State Circuits 1978, 13, 28-33.

Irfan, M. Zhang, H. Ding, C. W. Tang and Y. Gao, Strong interface p-doping and band bending in c60 on moox, Org. Electron. 12, 1588 (2011).

Ishii, H.; Hayashi, N.; Ito, E.; Washizu, Y.; Sugi, K.; Kimura, Y.; Niwano, M.; Ouchi, O.; Seki, K., Kelvin Probe Study of Band Bending at Organic Semiconductor/Metal Interfaces: Examination of Fermi Level Alignment. Physics of Organic Semiconductors 2006, 69-94.

Janesick, J. R.; Elliott, T.; Collins, S.; Blouke, M. M.; Freeman, J., Scientific Charge-Coupled-Devices. Opt Eng 1987, 26, 692-714.

Kang, S. J.; Yi, Y.; Kim, C. Y.; Cho, S. W.; Noh, M.; Jeong, K.; Whang, C. N., Energy level diagrams of C60/pentacene/Au and pentacene/C60/Au. Synthetic Metals 2006, 156, 32-37.

Kumar, A.; Devine, R.; Mayberry, C.; Lei, B.; Li, G.; Yang, Y., Origin of Radiation-Induced Degradation in Polymer Solar Cells. Advanced Functional Materials 2010, 20, 2729-2736.

O'Neill, M. J.; Piszczor, M. F.; Eskenazi, M. I.; McDanal, A. J.; George, P. J.; Botke, M. M.; Brandhorst, H. W.; Edwards, D. L.; Hoppe, D. T., Ultra-light stretched Fresnel lens solar concentrator for space power applications. Proc. SPIE 5179, Optical Materials and Structures Technologies 2003, 5179, 116-126.

Paterno, G. M.; Robbiano, V.; Fraser, K. J.; Frost, C.; Sakai, V. G.; Cacialli, F., Neutron Radiation Tolerance of Two Benchmark Thiophene-Based Conjugated Polymers: the Importance of Crystallinity for Organic Avionics. Scientific Reports 2017, 7.

Schreurs, D.; Nagels, S.; Cardinaletti, I.; Vangerven, T.; Cornelissen, R.; Vodnik, J.; Hruby, J.; Deferme, W.; Manca, J. V., Methodology of the first combined in-flight and ex situ stability assessment of organic-based solar cells for space applications. Journal of Materials Research 2018, 33, 1841-1852.

Street, R. A.; Schoendorf, M., Interface state recombination in organic solar cells. Phys Rev B 2010, 81.

Takada, S.; Ihama, M.; Inuiya, M., CMOS image sensor with organic photoconductive layer having narrow absorption band and proposal of stack type solid-state image sensors. Proc SPIE 2006, 6068.

Tanaka, Y.; Kanai, K.; Ouchi, Y.; Seki, K., Oxygen effect on the interfacial electronic structure of C60 film studied by ultraviolet photoelectron spectroscopy. Chemical Physics Letters 2007, 441, 63-67.

Tiffenberg, J.; Sofo-Haro, M.; Drlica-Wagner, A.; Essig, R.; Guardincerri, Y.; Holland, S.; Volansky, T.; Yu, T. T., Single-Electron and Single-Photon Sensitivity with a Silicon Skipper CCD. Phys Rev Lett 2017, 119.

Veenstra, S. C.; Heeres, A.; Hadziioannou, G.; Sawatzky, G. A.; Jonkman, H. T., On interface dipole layers between C60 and Ag or Au. Applied Physics a-Materials Science & Processing 2002, 75, 661-666.

* cited by examiner

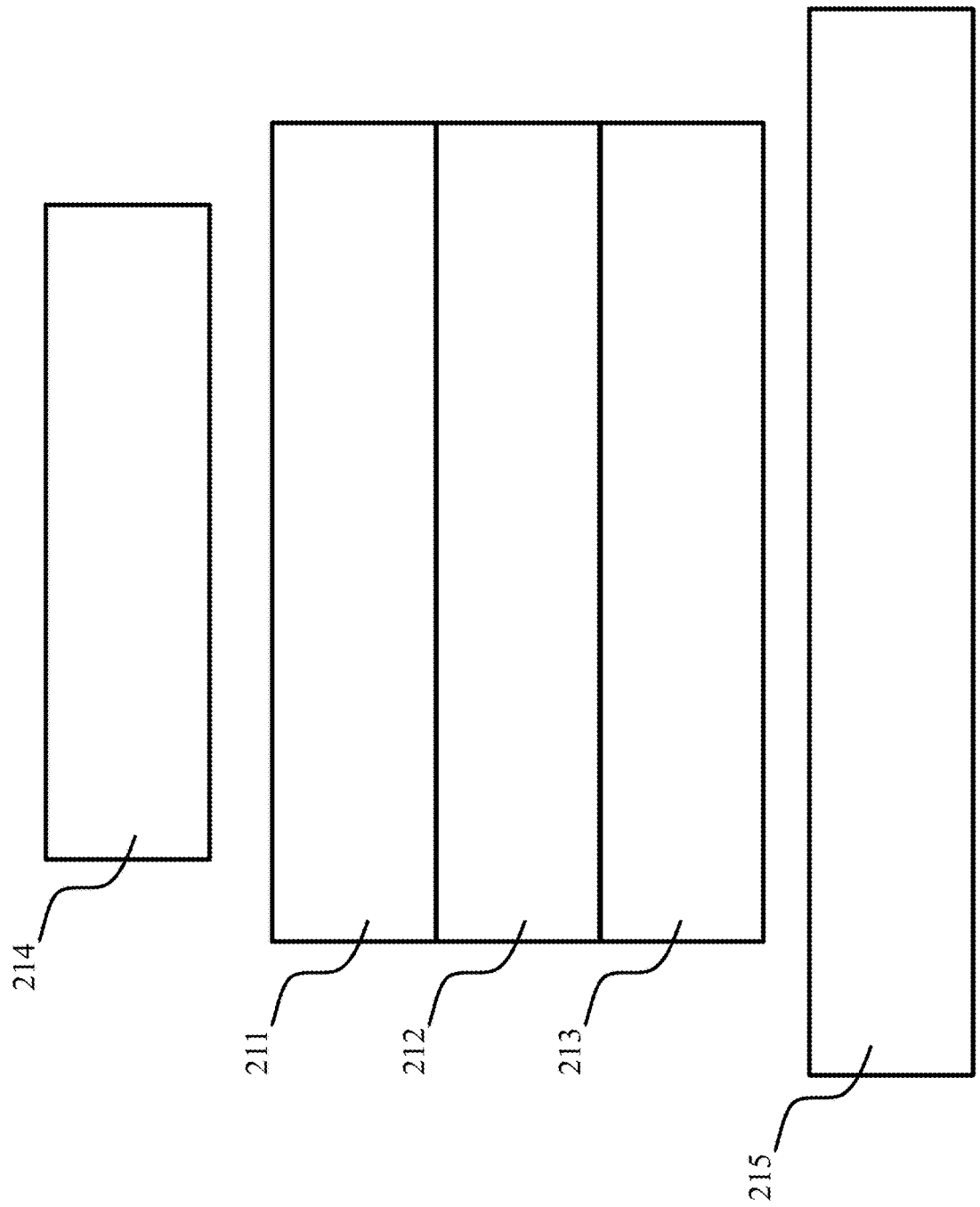

ORGANIC OPTOELECTRONIC DEVICE

CROSS-REFERENCE TO RELATED APPLICATIONS

This application claims priority to U.S. Provisional Application No. 62/877,550 filed on Jul. 23, 2019, incorporated herein by reference in its entirety.

STATEMENT REGARDING FEDERALLY SPONSORED RESEARCH OR DEVELOPMENT

This invention was made with government support under FA9550-18-1-0162 awarded by the Air Force Office of Scientific Research (AFOSR). The government has certain rights in the invention

BACKGROUND OF THE INVENTION

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into electricity. Charged coupled devices (CCDs) manipulate charge packets near a semiconductor-insulator interface, allowing them to be passed between closely spaced metal-oxide-semiconductor (MOS) capacitors. Since their conception in 1970, CCDs have been successfully applied to high sensitivity optical imaging and are valued for their excellent signal-to-noise ratio, high quantum efficiency, linearity, and speed. Because practical sensors require charges to transport laterally across millimeter-to-centimeter distances for imaging, CCDs based on organic semiconductors have not been practical due to their typically low charge diffusivities and short photogenerated carrier lifetimes. However, the recent demonstration of efficient charge transport across distances of several centimeters in organic thin film heterostructures using energetic barriers to physically separate electron and hole polarons opens the possibility for realizing organic CCDs (OCCDs).

Traditionally, photosensitive optoelectronic devices have been constructed of a number of inorganic semiconductors, e.g., crystalline, polycrystalline and amorphous silicon, gallium arsenide, cadmium telluride, and others.

More recent efforts have focused on the use of organic materials in CCDs. Organic semiconductors are typically unsuited for such an application due to their low charge mobilities and short carrier lifetimes. However, organic CCDs offer a low-cost, light-weight, and mechanically flexible route to photoelectric conversion. Compared with polymers, small molecule OPVs share the advantage of using materials with well-defined molecular structures and weights. This leads to a reliable pathway for purification and the ability to deposit multiple layers using highly controlled thermal deposition without concern for dissolving, and thus damaging, previously deposited layers.

While organic CCDs present advantages in ease of manufacturing and material availability, organic materials present a challenge in the difficulty of efficient, controlled, and precise lateral charge movement necessary to precisely measure light intensity and then move the resulting charge packet to the support circuitry at the periphery of the device for digitization.

As such, there remains a need to develop an organic CCD implemented with photogeneration pixel regions feeding into a support system that is capable of storing and moving charge packets without substantial signal loss.

SUMMARY OF THE INVENTION

In one aspect, an organic optoelectronic device comprises a substrate having first and second regions, a first electrode positioned over the first region of the substrate, a shutter electrode positioned over the second region of the substrate, an organic heterojunction layer comprising an organic heterojunction material, positioned over at least a portion of the first electrode, an insulator layer positioned over at least a portion of the shutter electrode, an organic channel layer, comprising an organic channel material, positioned over at least a portion of the heterojunction and insulator layers, and a second electrode positioned over the channel layer in the second region of the substrate, wherein the shutter electrode is configured to generate a repulsive potential barrier in the channel layer, suitable to at least reduce movement of charge in the channel layer, and wherein an energy barrier between the organic heterojunction material and the organic channel material is at least 300 meV.

In one embodiment, the first electrode is an anode and the second electrode is a cathode. In one embodiment, the device further comprises a driver circuit configured to bias the shutter electrode at a first repulsive potential and a second passive potential. In one embodiment, the second passive potential is a ground potential. In one embodiment, the second electrode is one terminal of a plurality of terminals of a shift register, the plurality of terminals positioned along a shift register axis, the second region of the channel layer extending along the shift register axis, and the device further comprises at least one guard electrode configured to create a repulsive potential barrier in the channel layer, preventing movement of charge along the shift register axis.

In one embodiment, the device further comprises a driver circuit configured to bias the at least one guard electrode at a first repulsive potential and a second passive potential. In one embodiment, the shutter electrode completely bisects the channel layer between the organic heterojunction layer and the second electrode. In one embodiment, the device further comprises a buffer layer positioned over at least a portion of the channel layer. In one embodiment, the device further comprises a buffer layer positioned between the channel layer and the insulator layer. In one embodiment, the channel layer comprises fullerene. In one embodiment, the shutter electrode comprises a metal selected from the group consisting of Ti and Al. In one embodiment, the heterojunction layer comprises 2-((7-(4-(dip-tolylamino)phenyl)benzo[c][1,2,5]thiadiazol-4-yl)methylene)malononitrile. In one embodiment, the heterojunction layer and the channel layer comprise fullerene.

In one embodiment, the device further comprises a plurality of additional second electrodes, each second electrode configured to receive a quantity of charge from at least one heterojunction and a plurality of readout circuits, each connected to one of the plurality of second electrodes. In one embodiment, the heterojunction has a diameter in a range of 1 μm to 20 μm.

In one aspect, a method of measuring received light in an optoelectronic device, the device comprising first and second electrodes, an insulated shutter electrode, a heterojunction layer positioned over at least a portion of the first electrode, and a channel layer positioned over at least a portion of the heterojunction layer and insulated shutter electrode, comprises the steps of converting a quantity of light received in a heterojunction into a charge packet, biasing a shutter electrode to a repulsive potential, thereby holding the charge packet in a first region of a channel layer, the shutter electrode electrically isolated from the channel layer, biasing the shutter electrode to a passive potential, moving the charge packet in a first direction to a second region of the channel layer, the second region located on the opposite side of the shutter electrode from the first region, and collecting the charge packet at an electrode electrically connected to the second region of the channel layer.

In one embodiment, the method further comprises the step of biasing the shutter electrode to the repulsive potential and biasing a guard electrode to a repulsive potential, thereby holding the charge packet in the second region of the channel layer, biasing the guard electrode to a passive potential, and moving the charge packet in a second direction perpendicular to the first direction, to a third region in the channel layer, the third region located on the opposite side of the guard electrode from the second region. In one embodiment, the method further comprises exposing the heterojunction to multicolored light, and converting only a subset of the multicolored light into the charge packet, the subset selected from the group consisting of red light, green light, and blue light.

In one embodiment, the method further comprises moving a second charge packet in the second direction, along the channel layer, the second charge packet converted from a second, different subset of the multicolored light. In one embodiment, the method further comprises amplifying the collected charge packet with a transimpedance amplifier. In one embodiment, the method further comprises first biasing the shutter electrode to a repulsive potential, expelling background charge from the channel layer.

In one embodiment, the device further comprises at least second, third, and fourth shutter electrodes positioned along a shift register axis of the channel layer, and the method further comprises the step of sequentially clocking the shutter electrodes to move the charge packet along the shift register axis. In one embodiment, the method further comprises moving a plurality of charge packets along the shift register axis simultaneously. In one embodiment, the channel layer comprises a plurality of regions separated by a plurality of shutter electrodes, and the method further comprises biasing at least two of the plurality of shutter electrodes to the same repulsive potential at the same time, and clocking the plurality of shutter electrodes to move a plurality of charge packets along the shift register axis.

BRIEF DESCRIPTION OF THE DRAWINGS

The foregoing purposes and features, as well as other purposes and features, will become apparent with reference to the description and accompanying figures below, which are included to provide an understanding of the invention and constitute a part of the specification, in which like numerals represent like elements, and in which:

FIG. 2B is a partial schematic of an organic CCD having multiple stacked heterojunctions;

DETAILED DESCRIPTION

Figure 1:
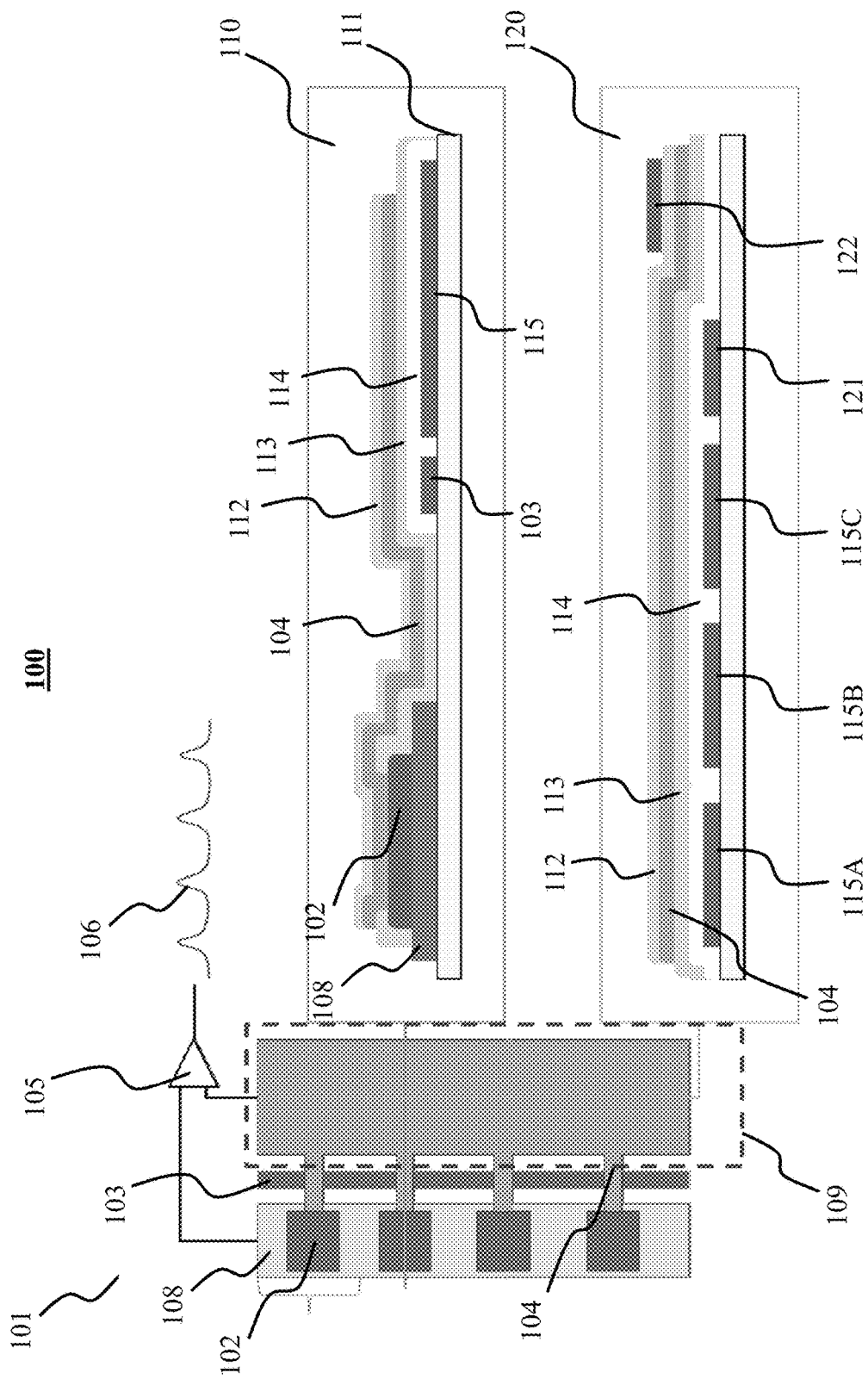
FIG. 1 is a diagram of an exemplary one-dimensional, organic charge-coupled device.

It is to be understood that the figures and descriptions of the present invention have been simplified to illustrate elements that are relevant for a clear understanding of the present invention, while eliminating, for the purpose of clarity, many other elements found in related systems and methods. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein. The disclosure herein is directed to all such variations and modifications to such elements and methods known to those skilled in the art.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, exemplary methods and materials are described.

As used herein, each of the following terms has the meaning associated with it in this section.

The articles "a" and "an" are used herein to refer to one or to more than one (i.e., to at least one) of the grammatical object of the article. By way of example, "an element" means one element or more than one element.

"About" as used herein when referring to a measurable value such as an amount, a temporal duration, and the like, is meant to encompass variations of ±20%, ±10%, ±5%, ±1%, and ±0.1% from the specified value, as such variations are appropriate.

Throughout this disclosure, various aspects of the invention can be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, 6 and any whole and partial increments therebetween. This applies regardless of the breadth of the range.

Various non-limiting examples of organic CCDs and compositions within various layers of an organic CCD are described in greater detail below.

As used herein, the terms "electrode" and "contact" may refer to a layer that provides a medium for delivering current to an external circuit or providing a bias current or voltage to the device. For example, an electrode, or contact, may provide the interface between the active regions of an organic photosensitive optoelectronic device and a wire, lead, trace or other means for transporting the charge carriers to or from the external circuit. Examples of electrodes include anodes and cathodes, which may be used in a photosensitive optoelectronic device.

As used herein, the term "charge injection element" refers to any element configured to deliver an amount of electric charge to another element to which it is electrically connected. An electrode or contact may be considered a charge injection element, but a heterojunction may also be considered to be a charge injection element, because a heterojunction may be configured to convert a quantity of light to a quantity of electric charge. Further examples of charge injection elements include, but are not limited to, acoustic or mechanical transducers, piezoelectric elements, or inductive coils.

As used herein, the term "transparent" may refer to a material that permits at least 50% of the incident electromagnetic radiation in relevant wavelengths to be transmitted through it. In a photosensitive optoelectronic device, it may be desirable to allow the maximum amount of ambient electromagnetic radiation from the device exterior to be admitted to the photoconductive active interior region. That is, the electromagnetic radiation must reach a photoconductive layer(s), where it can be converted to electricity by photoconductive absorption. This often dictates that at least one of the electrical contacts or electrodes should be minimally absorbing and minimally reflecting of the incident electromagnetic radiation. In some cases, such a contact should be transparent or at least semi-transparent. In one embodiment, the transparent material may form at least part of an electrical contact or electrode.

As used herein, the term "semi-transparent" may refer to a material that permits some, but less than 50% transmission of ambient electromagnetic radiation in relevant wavelengths. Where a transparent or semi-transparent electrode is used, the opposing electrode may be a reflective material so that light which has passed through the cell without being absorbed is reflected back through the cell.

As used and depicted herein, a "layer" refers to a member or component of a device, for example an optoelectronic device, being principally defined by a thickness, for example in relation to other neighboring layers, and extending outward in length and width. It should be understood that the term "layer" is not necessarily limited to single layers or sheets of materials. In addition, it should be understood that the surfaces of certain layers, including the interface(s) of such layers with other material(s) or layers(s), may be imperfect, wherein said surfaces represent an interpenetrating, entangled or convoluted network with other material(s) or layer(s). Similarly, it should also be understood that a layer may be discontinuous, such that the continuity of said layer along the length and width may be disturbed or otherwise interrupted by other layer(s) or material(s).

As used herein, a "photoactive region" refers to a region of a device that absorbs electromagnetic radiation to generate excitons. Similarly, a layer is "photoactive" if it absorbs electromagnetic radiation to generate excitons. The excitons may dissociate into an electron and a hole in order to generate an electrical current.

As used herein, the terms "donor" and "acceptor" refer to the relative positions of the highest occupied molecular orbital ("HOMO") and lowest unoccupied molecular orbital ("LUMO") energy levels of two contacting but different organic materials. If the LUMO energy level of one material in contact with another is lower, then that material is an acceptor. Otherwise it is a donor. It is energetically favorable, in the absence of an external bias, for electrons at a donor-acceptor junction to move into the acceptor material, and for holes to move into the donor material.

As used herein, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Because ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, the term "band gap" ($E_g$) of a polymer may refer to the energy difference between the HOMO and the LUMO. The band gap is typically reported in electron volts (eV). The band gap may be measured from the UV-vis spectroscopy or cyclic voltammetry. A "low band gap" polymer may refer to a polymer with a band gap below 2 eV, e.g., the polymer absorbs light with wavelengths longer than 620 nm.

As used herein, the term "excitation binding energy" ($E_B$) may refer to the following formula: $E_B=(M^++M^-)-(M^*+M)$, where $M^+$ and $M^-$ are the total energy of a positively and negatively charged molecule, respectively; $M^*$ and $M$ are the molecular energy at the first singlet state ($S_1$) and ground state, respectively. Excitation binding energy of acceptor or donor molecules affects the energy offset needed for efficient exciton dissociation. In certain examples, the escape yield of a hole increases as the HOMO offset increases. A decrease of exciton binding energy $E_B$ for the acceptor molecule leads to an increase of hole escape yield for the same HOMO offset between donor and acceptor molecules.

An exemplary one-dimensional, organic charge-coupled device of the present disclosure is shown in FIG. 1. Device 100 is shown with main overhead view 101 and cross-sectional views 110 and 120. With reference to view 101, a row of organic heterojunctions 102 is positioned over a shared anode 108, the anode 108 connected to one input of a readout circuit 105 configured to convert input current to an output voltage 106. The organic heterojunctions 102 are electrically connected to a shared channel layer 104, which facilitates lateral transport of charge packets from the organic heterojunctions 102 to a shift register portion 109 of the channel layer 104, then on to the collector 122 (see cross-section 120). The shutter electrode 103 is positioned over a substrate 111, and beneath the branches of the channel layer 104 leading to each heterojunction. The channel layer may in some embodiments be shielded by top and bottom buffer layers 112 and 113, as well as insulating layer 114 (see cross-section 110). In some embodiments, the channel layer may comprise an organic material.

Device 100 may be configured to convert incoming light or electromagnetic radiation into a charge packet at organic heterojunctions 102, with the shutter electrode 103 biased at a repulsive electric potential, holding the charge packet in a region of the channel layer adjacent to the organic heterojunctions 102. In some embodiments, the repulsive potential is a negative potential, for example between −7 and −10 V, but may in other embodiments be between −5 and −7 V, or between −4 and −5 V, or between −3 and −7 V, or between −2.5 and −3.3 V, or between −3.3 and −5 V. In some embodiments, a weaker (i.e. less negative) repulsive potential may be used where the channel layer and/or the barrier layers are thinner. As used herein, two repulsive negative potentials may be compared as "greater than" or "less than" one another. As would be understood by one skilled in the art, the term "greater than" may be understood to mean "more negative than" where both potentials being compared are negative. Thus, a repulsive potential of −12 V may be referred to herein as greater than a repulsive potential of −7 V. Similarly, a repulsive potential of −3 V may be referred to herein as less than a repulsive potential of −7 V.

The incoming light or electromagnetic radiation may be converted into photogenerated electrons and holes in the heterojunction 102, with some or all of the photogenerated holes collected through the anode 108, and some or all of the photogenerated electrons diffusing across the channel 104 to the shift register portion 109 of channel layer 104. The shutter electrode 103 may then switch to a passive or neutral potential, and moving the charge packet across to the shift register portion 109 of the channel layer 104.

As shown in further detail in cross-section 120, the shift register portion 109 of the channel layer may be configured as a shift register having a plurality of shift register electrodes 115, 115A, 115B, and 115C, and a guard electrode 121. The shift register electrodes 115, 115A, 115B, 115C function similarly to the shutter electrode, charged with a repulsive potential in order to hold the charge packet(s) in their positions in the shift register portion 109 of channel layer 104. As discussed in more detail below, the shift register electrodes may then be switched to a passive or neutral potential to move the charge packets to the next position in the shift register. In this way, one or more pixels worth of intensity information may be moved in serial or parallel from the heterojunctions 102 to the shift register portion 109 of the channel layer 104, then the intensity information may be moved serially along the shift register portion 109 to collector electrode 122, where in some embodiments it may pass to a second input of readout circuit 105 to be converted to a voltage level 106. This voltage level may then for example be measured by an analog-to-digital converter for conversion to digital data.

In some embodiments, the shift register electrodes 115A, 115B, and 115C may be configured in groups of three electrodes per photogeneration area, held in phases. For example, a sequence of electrodes may be arranged in a sequence 1, 2, 3, 1, 2, 3, 1, 2, 3, . . . where the voltages of phases 1-3 are manipulated sequentially to move the charge packets across the shift register region 109 of the channel layer 104 (referred to interchangeably herein as "the shift register"), while maintaining charge packet integrity. When the electron packets reach the collection electrode 122, they are read out by a readout circuit 105, for example a current amplifier, as a sequence of pulses, with one pulse corresponding to one charge packet. Some embodiments include an additional electrode 121 separating the phases of the shift register from the collection electrode 122, denoted as the guard.

As understood herein, channel layer 104 and bottom buffer layers 112 and 113 combine to form a lateral charge transport layer from the heterojunction 102 to collector electrode 122. More details about the lateral charge transport behavior may be found in Burlingame, Q., et al. Centimetre-scale electron diffusion in photoactive organic heterostructures. Nature 554, 77-80 (2018), incorporated herein by reference.

In one embodiment, the heterojunction layer comprises a first material having a lowest unoccupied molecular orbital (LUMO) having a first energy, and the channel layer comprises a second material having a LUMO having a second energy, wherein the energy barrier (the difference between the first energy and the second energy) is at least 100 meV, at least 200 meV, at least 250 meV, at least 300 meV, at least 310 meV, at least 320 meV, at least 325 meV, at least 350 meV, at least 375 meV, at least 400 meV, at least 500 meV, or more. As used herein, the "energy barrier" between two materials is understood to refer to the difference (in eV) between the LUMO of the two materials. The channel layer may comprise any suitable material, but may in one embodiment comprise fullerene, for example $C_{60}$ or $C_{70}$.

The embodiment depicted in FIG. 1 is a simplified demonstration including four heterojunctions in a single row. Depending on the application, a single heterojunction may represent a pixel or a subpixel. It is understood that devices and methods of the present disclosure may be adapted for use in two-dimensional sensors having many more pixels or subpixels arranged in multiple columns and rows.

Although embodiments of the invention are depicted with organic semiconductors, it is understood that the general principles behind the devices and methods disclosed herein could be applied to other semiconductors, including inorganics such as Si, any III-V semiconductor, including but not limited to GaAs, InGaAs, GaN, InN, InSb, or GaSb. The devices and methods disclosed herein may also be used with a II-VI semiconductor, for example CdTe, CdS, CdSe, ZnS, ZnTe, etc. In some embodiments, other inorganic semiconductors may be used, for example if the semiconductor layer is sufficiently thin and has low enough charge density that intrinsic charge can be depleted by biasing one or more insulated electrodes.

The speed of the readout can be increased in some embodiments by using higher diffusivity semiconductors and/or smaller electrodes. The time constant for diffusive transport scales inversely to diffusivity and proportionally to the square of the length of the electrodes.

Figure 2A:
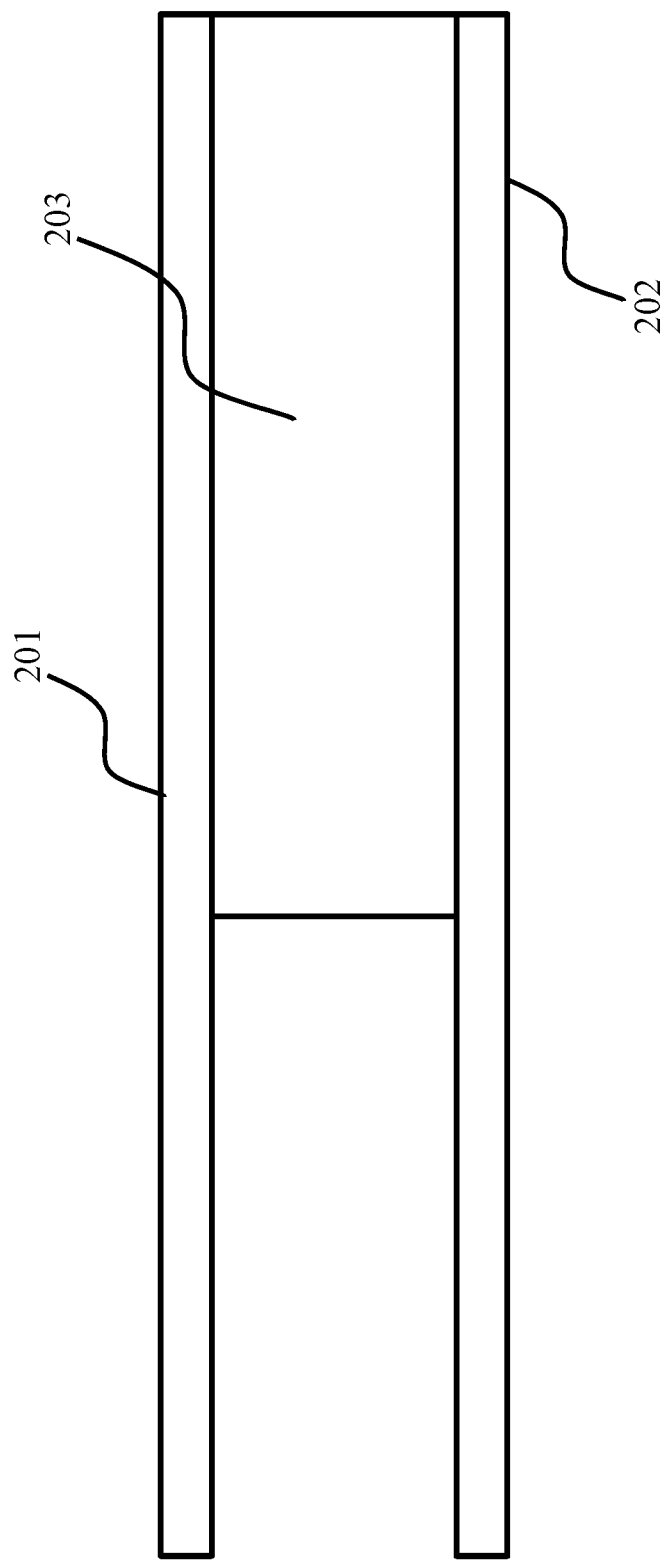
FIG. 2A is a diagram of a sheet resistor phase electrode.

The speed may also be improved in some embodiments by using drift as well as diffusive transport, for example by using fringing fields, many thin phase lines per pixel, or sheet resistor phase electrodes connected to high conductivity connectors, as shown in FIG. 2A.

With reference to FIG. 2A, two metal electrodes 201 and 202 connect to opposite sides of a resistive sheet 203. A potential difference between the electrodes 201 and 202 creates a linear gradient in the potential of the channel above the resistive portion of the electrode, introducing drift transport in the channel.

Figure 17:
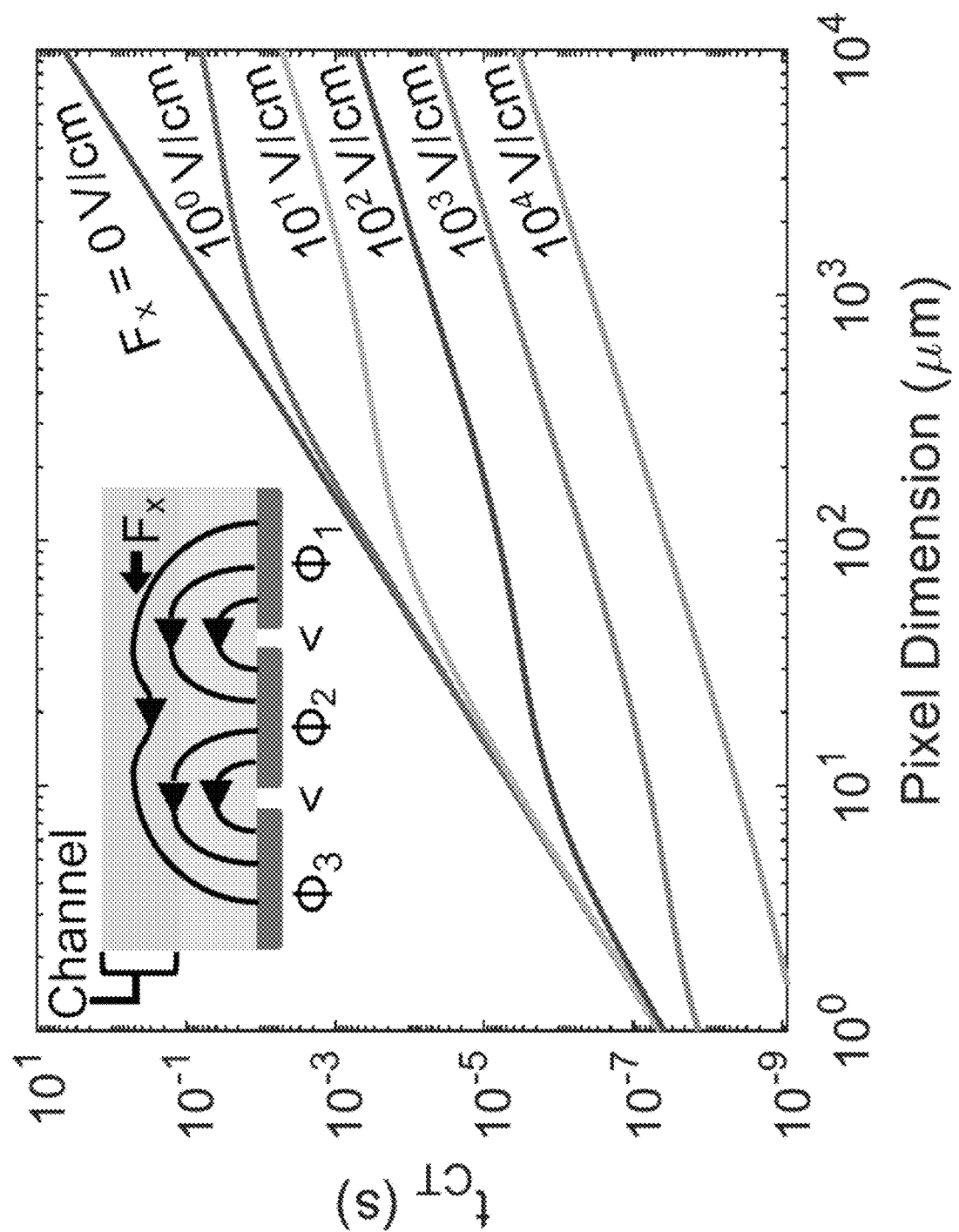
FIG. 17 is a graph of simulated charge transfer time versus electrode size.

Another depiction of drift-induced fringing fields is shown in the inset of FIG. 17. When the electrode-channel spacing is similar to the electrode length, applying voltages such that $\Phi_1 > \Phi_2 > \Phi_3$ establishes a significant lateral "fringing field", $F_x$, in the channel above $\Phi_2$. Black lines represent electric field lines, with arrows indicating direction. Using repulsive potentials rather than attractive potentials allows the majority carrier of a semiconductor to be used as the signal medium.

In one embodiment, readout time may be increased by increasing the size of each pixel. Pixels may have a diameter of between 1 μm and 20 μm, or between 3 μm and 8 μm, or between 6 μm and 7 μm. In one embodiment, a pixel may have a diameter of between 8 μm and 20 μm, or between 9 μm and 15 μm, or around 10 μm. In other embodiments, pixels may have any suitable diameter.

In one embodiment, readout time may be increased by increasing the number of readout amplifiers in the system. In the contemplated example of FIG. 1, the system includes a single readout amplifier, and so pixels are clocked off in series along the shift register to the readout amplifier. It is understood that by adding a second readout amplifier along a different point in the shift register, the readout time may be halved, because two pixels may be read out at once. Similarly, in a larger-scale system, readout time may be increased by adding more readout amplifiers so that more pixels may be read out in parallel. In one embodiment, an OCCD having a grid of pixels arranged in a plurality of columns may have one readout amplifier per column, or one readout amplifier per every two columns, or one readout amplifier for every four, five, eight, ten, twenty, or any other subset of the plurality of columns.

In one embodiment, an OCCD may be configured with very high pixel fill factor, for example more than 50% pixel fill factor, more than 60% pixel fill factor, more than 70% pixel fill factor, more than 80% pixel fill factor, more than 90% pixel fill factor, more than 95% pixel fill factor, or about 100% pixel fill factor. Existing CCDs use multiple heterojunctions with color filters positioned over them in order to capture light intensity in three different colors. However, because some organic heterojunctions may be transparent or semi-transparent to certain wavelengths of light, in one embodiment an organic CCD may be configured with pixel triads absorbing in different spectral regions, wherein multicolored light passes through multiple organic heterojunctions without color filters.

An exemplary partial view of a device with multiple transparent or semi-transparent heterojunctions is shown in FIG. 2B. The device of FIG. 2B includes three heterojunction elements 211, 212, and 213 positioned between first and second electrodes 214 and 215. In some embodiments, at least one of electrodes 214 and 215 is transparent. In some embodiments, one of the electrodes 214 and 215 is positioned elsewhere in the device, for example in another region of one or more channel layers electrically connected to one of the heterojunctions 211, 212, and 213. In some embodiments, the heterojunctions 211, 212, and 213 may have channel and/or buffer layers positioned between one another over at least a portion of the pixel region.

Also disclosed herein is a method of measuring electromagnetic radiation intensity, for example light intensity, using embodiments of devices disclosed herein. In one embodiment, and with reference to FIG. 1, a method may include the steps of receiving a quantity of light at a heterojunction 102, converting the quantity of light to a quantity of photogenerated electrons and holes at the heterojunction 102, collecting the holes at an anode 108 and storing the photogenerated electrons as a charge packet, for example in a channel layer 104 in the vicinity of the heterojunction 102 by biasing a shutter electrode 103 at a repulsive potential, which may in some embodiments be a negative potential.

Figure 3:
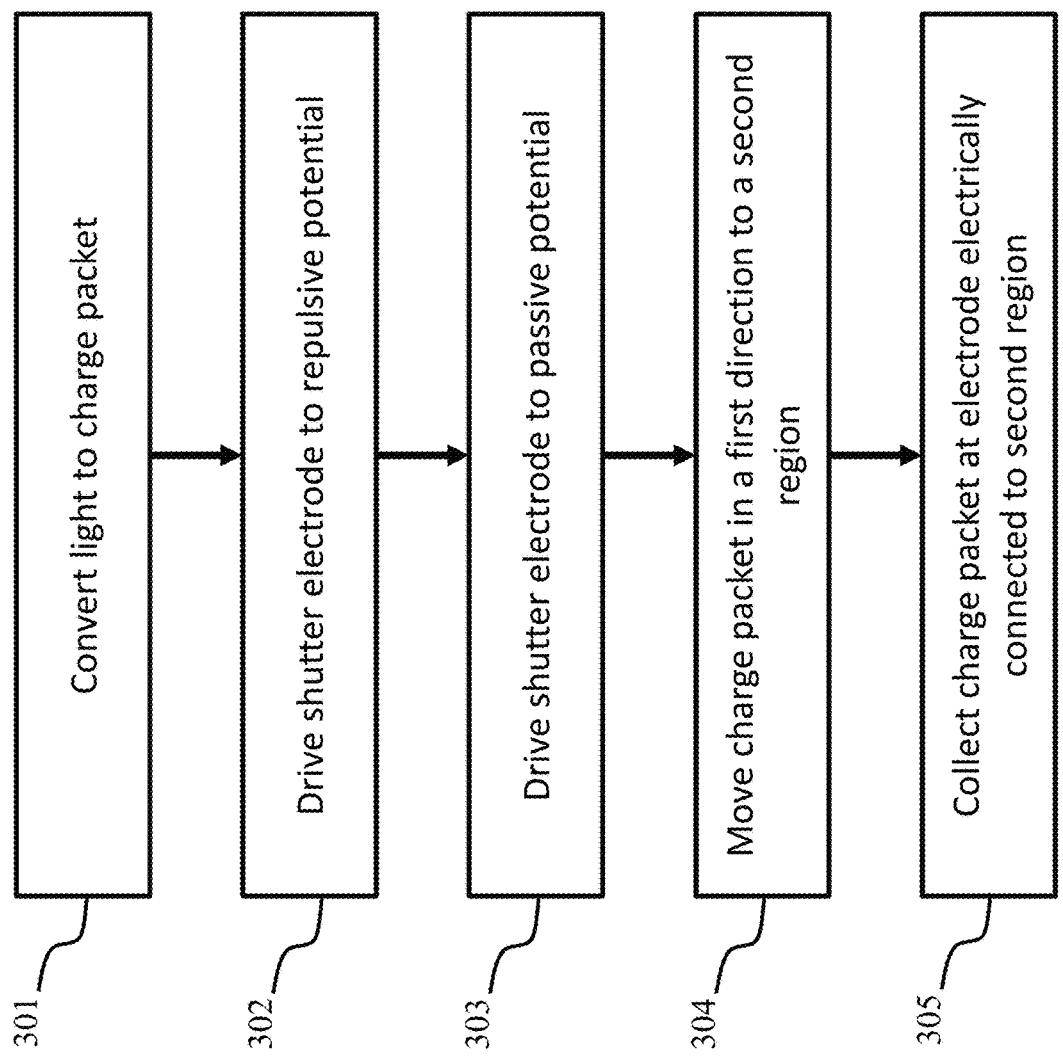
FIG. 3 is a method of the disclosure.

Another method of the disclosure is shown in FIG. 3. The depicted method includes the steps of converting a quantity of light received in a heterojunction into a charge packet in step 301, biasing a shutter electrode to a repulsive potential, thereby holding the charge packet in a first region of a channel layer, the shutter electrode electrically isolated from the channel layer in step 302, biasing the shutter electrode to a passive potential in step 303, moving the charge packet in a first direction to a second region of the channel layer, the second region located on the opposite side of the shutter electrode from the first region in step 304, and collecting the charge packet at an electrode electrically connected to the second region of the channel layer in step 305.

In some embodiments, a device fabricated according to the embodiments disclosed herein may have a background charge in a portion of one or more layers, for example in a channel layer. In one embodiment, a method of measuring electromagnetic radiation intensity may include the step of expelling the background charge from the one or more layers before measuring photogenerated charge packets, for example by biasing the guard and/or shutter electrodes to a repulsive potential for a period of time In one embodiment, the repulsive potential may be between −6 and −15 volts, or between −8 and −13 volts, or between −10 and −12 volts, or about −10 volts or about −12 volts. In some embodiments, a series of steps may be executed to expel background charge from a channel layer, for example a fullerene channel layer.

Figure 4A:
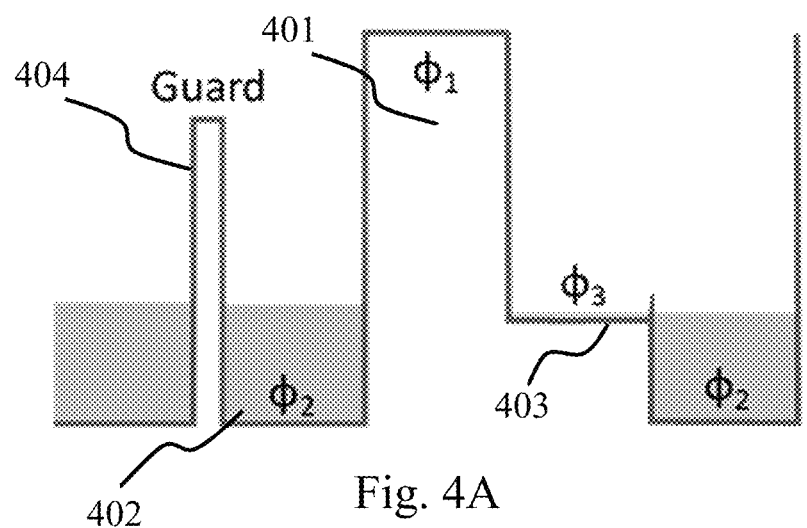
FIG. 4A, FIG. 4B, and FIG. 4C are a partial diagram of a background charge expelling process.
Figure 4B:
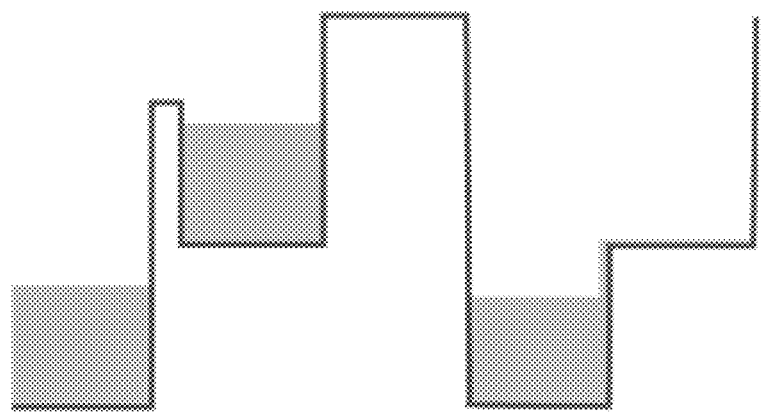
Figure 4C:
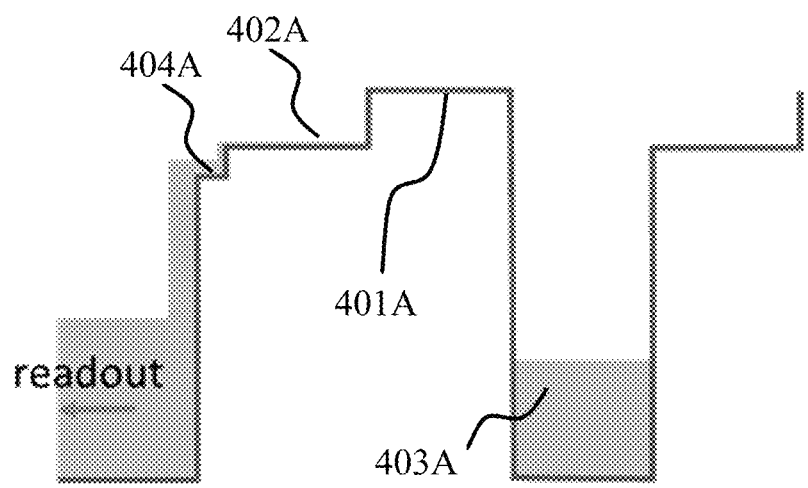

An exemplary background charge expelling process is shown in FIG. 4A, FIG. 4B, and FIG. 4C. In an initial step (not shown), phases 1 and 3 of the shift register, as well as the shutter electrode(s), are biased to a repulsive potential, for example −12 volts. The guard electrode is biased at a lesser repulsive potential of −10 volts. This has the effect of isolating the background charge in the phase 2 regions of the shift register (402) as shown in FIG. 4A.

In a second step shown across FIG. 4A, FIG. 4B, and FIG. 4C, the potential on phase 3 (403, 403A) is brought to ground, while the potential for phase 2 (402, 402A) is biased to a repulsive potential, for example −12 volts. In the depicted embodiment, the repulsive potential of the phase 2 electrode 402A is greater than the repulsive potential of the guard electrode 404A. In the final step of the process shown in FIG. 4C, the background charge which was in phase 2 of the shift register (402) pours over the guard electrode 404A into the readout circuit, for example a readout amplifier connected to the collection electrode.

The process continues in further steps, as would be understood by one skilled in the art. The background charge packet located in phase 3 of the shift register (403A) is shifted into the adjacent phase 1 position (401A), then to phase 2 (402A) before being shifted over the guard electrode 404A into the readout circuit.

Once the expulsion process is complete, there is little to no background charge left in the shift register. To inject photogenerated charges, the shutter potential is relaxed from a strong (~12V) blocking potential to a weak blocking potential (~9 V). In some embodiments, a method may include the step of determining the exact shutter potential by first relaxing the blocking potential until there begins to be a measurable increase in the background charge readout with continued shift register clocking (this extra background charge comes from leaking over the shutter electrode barrier). When the shutter potential barrier weakens sufficiently, light on the heterojunction will raise the potential of the electrons in the channel over the heterojunction, allowing them to spill over the shutter potential barrier. Thus, a procedure for measuring photogenerated charge may include steps of 1) using a strong shutter potential, expelling background charges from the shift register 2) change the shutter to a weak blocking potential and expose the pixels to light 3) return the shutter to a strong blocking potential and clock out the shift register.

EXPERIMENTAL EXAMPLES

The invention is further described in detail by reference to the following experimental examples. These examples are provided for purposes of illustration only, and are not intended to be limiting unless otherwise specified. Thus, the invention should in no way be construed as being limited to the following examples, but rather, should be construed to encompass any and all variations which become evident as a result of the teaching provided herein.

Without further description, it is believed that one of ordinary skill in the art can, using the preceding description and the following illustrative examples, make and utilize the system and method of the present invention. The following working examples therefore, specifically point out the exemplary embodiments of the present invention, and are not to be construed as limiting in any way the remainder of the disclosure.

Example #1—Device Fabrication

Figure 5B:
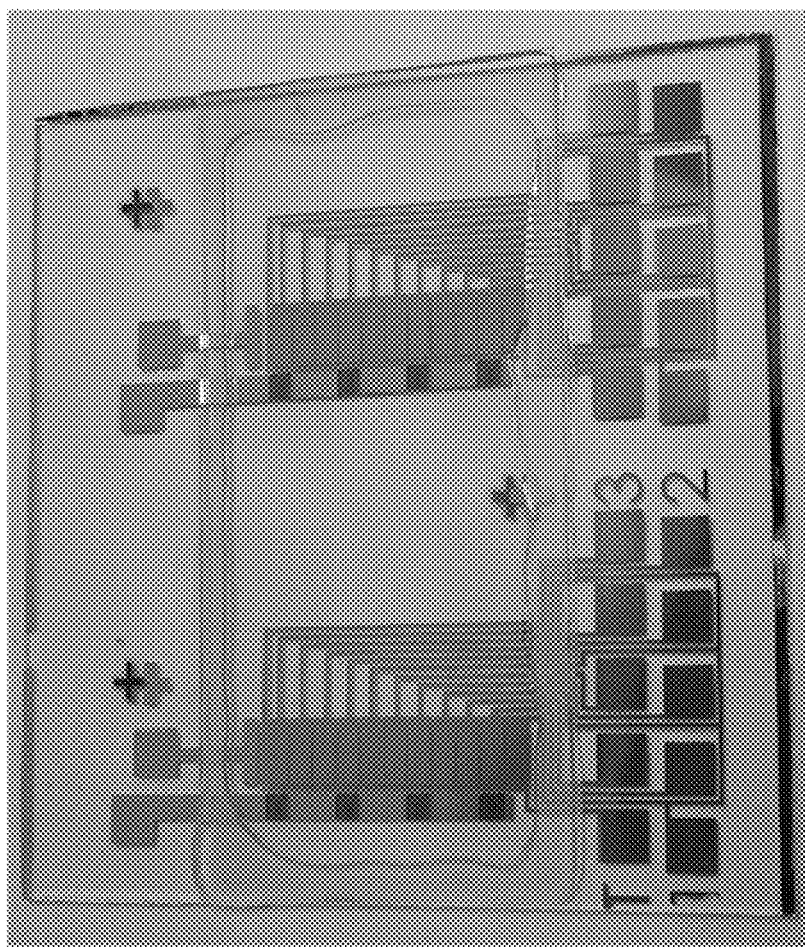
FIG. 5B is a photograph of a prototype of an exemplary one-dimensional organic charge-coupled device.
Figure 5A:
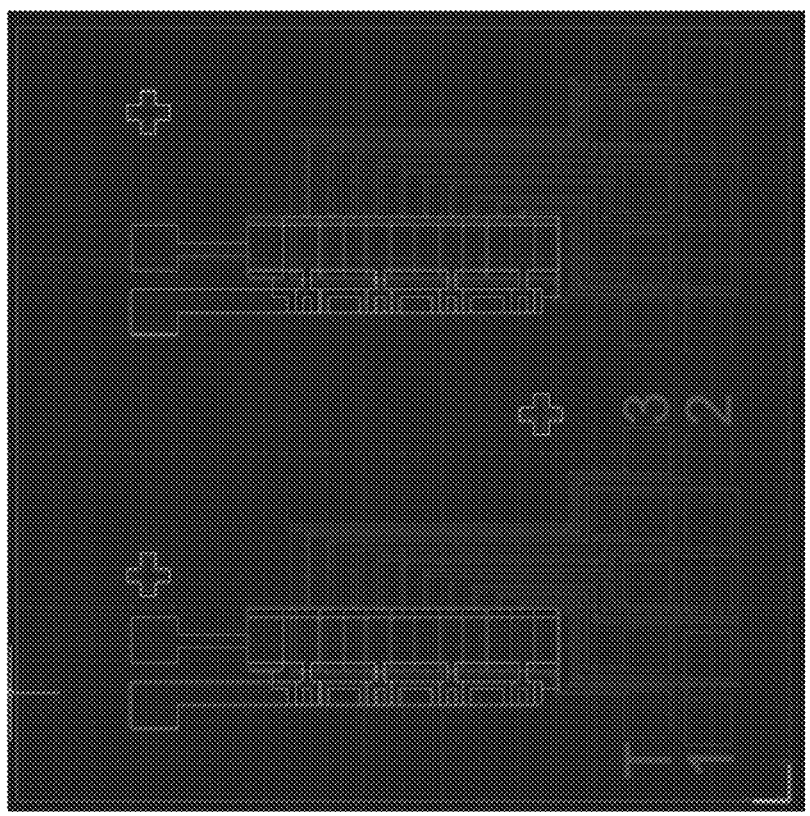
FIG. 5A is a mask diagram of an exemplary one-dimensional organic charge-coupled device.

A prototype device as shown in FIG. 5A and FIG. 5B was fabricated on a glass substrate. FIG. 5A shows the mask design for the device, while FIG. 5B shows a photograph of the finished prototype. Metal electrodes (5 nm Ti/60 nm Al) were patterned via photolithography for the shutter, phase electrodes, and guard. Alignment marks were included to aid in shadow masking subsequent layers. A gel contact mask was applied to the ten contacts along the bottom of the substrate, and then 50 nm $Al_2O_3$ was deposited using atomic layer deposition. The gel masks were then removed to expose the contact pads. All subsequent layers were patterned by shadow mask and deposited via vacuum thermal evaporation (VTE). 60 nm Ag anodes were deposited to the left of the shutter electrode. A 10 nm layer of $MoO_x$/and a 50 nm layer of heterojunction were then deposited in 1.5 mm squares over the anode using a separate shadow mask. The heterojunction was 1:1 fullerene $C_{70}$: 2-[(7-{4-[N,N-Bis(4-methylphenyl)amino]phenyl}-2,1,3-benzothiadiazol-4-yl)methylene]propanedinitrile (DTDCPB).

A new shadow mask was used to deposit a buffer layer covering the shift register, HJ, and anode, but leaving a centered 1 mm square area of the heterojunction exposed. The buffer was 20 nm 2,2',2"-(1,3,5-Benzinetriyl)-tris(1-phenyl-1-H-benzimidazole) (TPBi)/5 nm 4,7-Diphenyl-1,10-phenanthroline (BPhen). A new shadow mask was used to pattern the channel and top buffer layers via VTE. The channel and top buffer layers overlapped the HJ exposed area and connected to the laterally-aligned shift register electrode with a 1 mm wide strip. Additionally, a 3.5 mm-wide vertical strip of the channel and top buffer layers was centered on the shift register electrodes, such that there was uncovered electrode area on both sides of the channel/buffer strip, except where the vertical channel/buffer strip connected to the horizontal strips. The vertical channel/buffer strip covering the center of the shift register extended past the top but ended at the same place as the bottom shift register pad. In the depicted example, the channel layer was composed of 20 nm thick fullerene $C_{60}$, and the top buffer layer was 5 nm BPhen/3 nm TPBi. Finally, a different shadow mask was used to pattern collecting electrodes (60 nm Ag) above the shift register but overlapping the organic channel. The device was then encapsulated using a glass cover slide and UV cured epoxy seal as pictured in FIG. 5B, such that all organic materials were inside the encapsulated area.

Example #1—Expelling Background Charge

Figure 6:
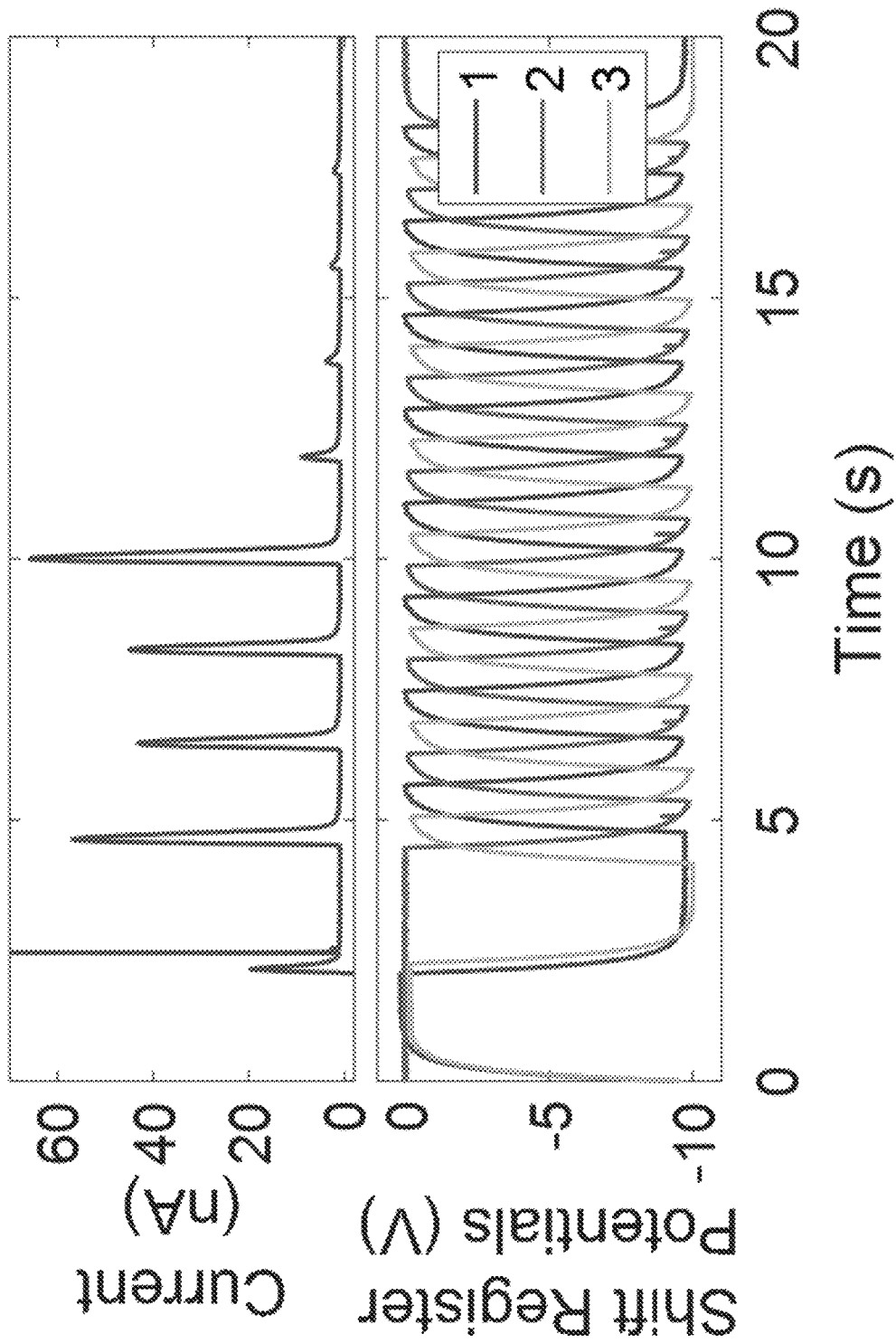
FIG. 6 is a set of graphs related to a background charge readout process.

The background charge expulsion process, as discussed in FIG. 4A-FIG. 4C and the accompanying description, was performed on the prototype device shown in FIG. 5B. The process was repeated, and because the prototype shown in FIG. 5B included four pixel elements, with continued shift register clocking, it was expected that four large current pulses would be measured, followed by smaller current pulses to charges that were left in between phase electrodes, trapped, or left behind due to charge transfer inefficiency. FIG. 6 shows data corresponding to this readout procedure.

Graph 601 of FIG. 6 shows the background charge readout from the readout circuit, while graph 602 of FIG. 6 shows the shift register potentials over time. The first pulse on the readout (601) corresponds to setting the electrode potentials in preparation for readout. The next four large pulses correspond to the four pixel background charge packets, followed by small residual charge packets. The electrode potentials (bottom) are switched slowly, with a time constant of about 300 ms, in order to give charge sufficient time to diffuse between electrode areas.

Example #1—Injecting and Measuring Photogenerated Charges

Figure 7:
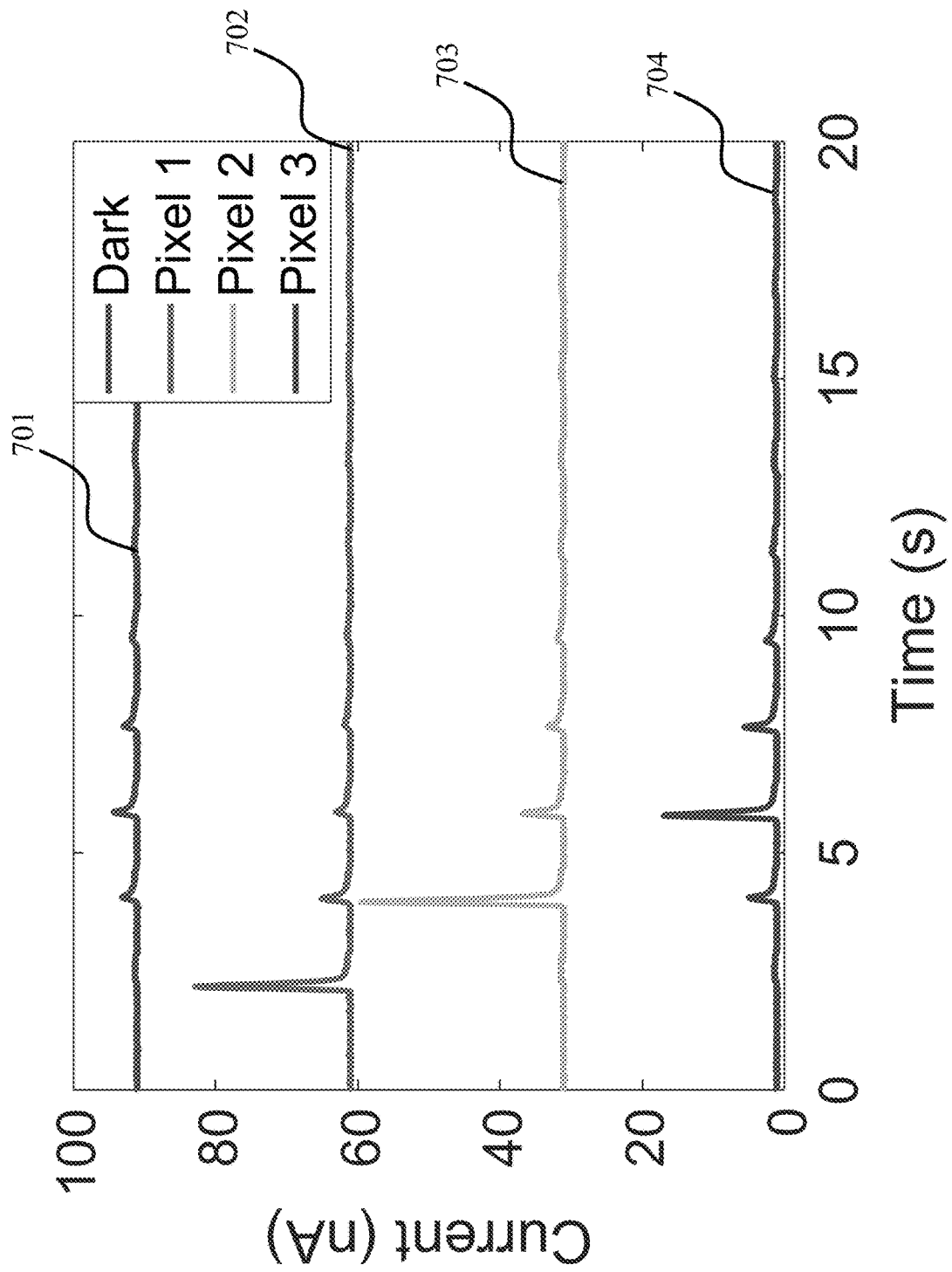
FIG. 7 is a set of graphs of single pixel exposure photo-generated charge signals.

With reference to FIG. 7, measured current is shown from a set of single pixel exposure photogenerated charge signals. The graph includes four curves, curve 701 measuring the dark signal, curve 702 measuring pixel 1, curve 703 measuring pixel 2, and curve 704 measuring pixel 3. During the measurements, no light was focused onto the dark pixel, and a laser was focused on pixels 1, 2, and 3 sequentially. The time delay between largest peaks of curves 702, 703, and 704 corresponds to the time for charge to be transferred forward by one pixel in the shift register. The small signal in dark curve 701 was due to leakage of charge over the shutter electrode. There was some residual charge trailing each photogenerated charge packet convolved with the dark response.

Example #2

In the second example, an OCCD was demonstrated that transfers photogenerated electron packets across a 1.78 cm long, linear, three-phase shift register. Reaching the end of the register, the packets are read out, providing information about the intensity and spatial distribution of the incident light. In contrast to the operation of conventional CCDs that attract minority carriers to depletion regions at the semiconductor-insulator interface, the electrodes of the n-type organic semiconductor shift register are negatively biased to manipulate charge via repulsive potential barriers that extend through the thin film semiconductor.

Example #2—Materials

Precoated ITO glass slides were purchased from Thin Film Devices. $C_{60}$ and $C_{70}$ were purchased from SES Research. 2,2',2"-(1,3,5-Benzinetriyl)-tris(1-phenyl-1-H-benzimidazole) (TPBi), 4,7-Diphenyl-1,10-phenanthroline (BPhen) and 2-((7-(4-(dip-tolylamino)phenyl)benzo[c][1,2,5]thiadiazol-4-yl)methylene)malononitrile (DTDCPB) were purchased from Luminescnece Technology Corp. All organic materials were purified via thermal gradient sublimation before device fabrication. $MoO_x$, Ag (99.99%) and Al (99.99%) were purchased from Alfa Aesar.

Example #2—Device Fabrication

Glass substrates were cleaned by sequential sonication in tergitol, deionized water, acetone, and isopropanol. A photoresist was deposited onto the substrate surface, and then patterned. The metal or oxide layers were deposited and the resist removed by soaking in Remover PG for >3 hrs at 80° C. Atomic layer deposition (ALD) was used to deposit $Al_2O_3$ by sequential gas pulse/purge cycles of TMAI and $H_2O$ at 100° C. in an Oxford OpAL. Organic materials and metals were deposited at rates of 0.5-1 Å/s through shadow masks in a vacuum thermal evaporator with a base pressure of $10^{-7}$ Torr. Devices were encapsulated in a $N_2$ environment with <1 ppm water and $O_2$ using a glass cover slide sealed to the substrate with a bead of UV cured epoxy around its periphery. A desiccant (CaO) was included inside package.

Figure 8:
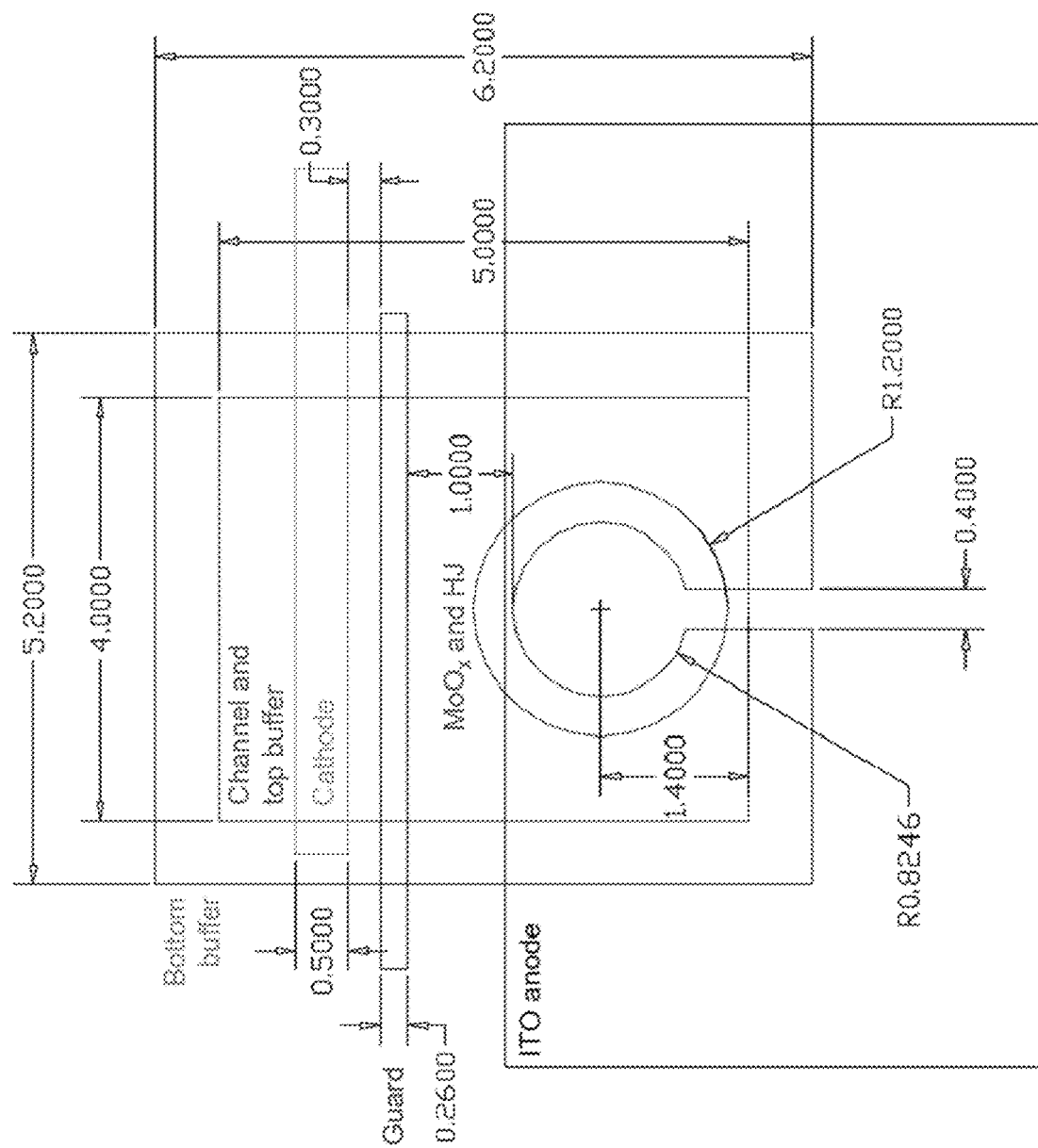
FIG. 8 is a schematic diagram of a single pixel transfer device.

Starting with a glass substrate having a strip of 11 mm wide, 70 nm thick prepatterned indium-tin-oxide (ITO) in the center, a stripe of 50 nm thick Al was deposited by vacuum thermal evaporation (VTE) to form the guard electrode, positioned parallel to the ITO. A 50 nm thick, ALD-grown $Al_2O_3$ was patterned via lift-off photolithography, exposing a 1.8 mm diameter circular area of ITO, with the edge of the circle intersecting the patterned edge of the ITO strip. All subsequent layers were deposited by VTE and patterned with shadow masks. Circular layers of 10 nm thick $MoO_x$ and 50 nm HJ were patterned centered on and overfilling the exposed ITO. Here, the heterojunction is 1:1 $DTDCPB:C_{70}$. A 20 nm thick TPBi buffer layer/5 nm thick BPhen was deposited in a rectangular region to prevent contact of the channel with $Al_2O_3$, but not covering the HJ over the exposed ITO. A channel patterned layer of 20 nm thick $C_{60}$ and buffer of 5 nm BPhen/3 nm TPBi was deposited through a shadow mask. Finally, a 50 nm thick, 0.5 mm wide stripe Ag cathode was deposited parallel to and spaced 0.3 mm from the insulated guard electrode, on the side opposite the ITO. Mask dimensions are given in FIG. 8. FIG. 8 depicts single pixel transfer device dimensions. All units are in mm. The ITO was prepatterned (extent of the ITO is not shown to scale). Subsequent layer deposition order was Al guard, $Al_2O_3$ (not shown, it covers everywhere except the circular area of the bottom buffer), $MoO_x$ and HJ, bottom buffer, channel and top buffer, then cathode.

Figure 9:
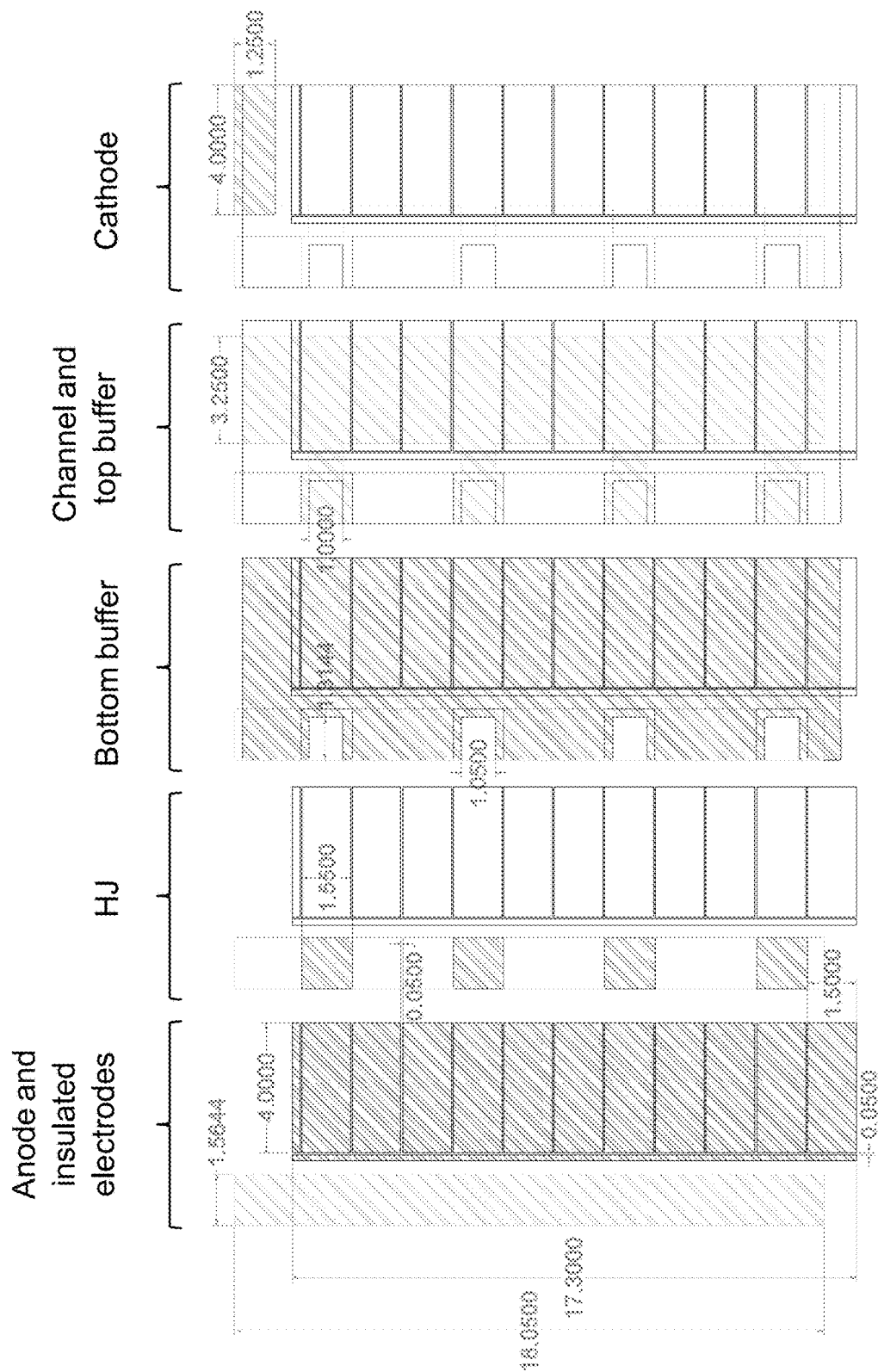
FIG. 9 is a diagram of mask dimensions.

Metal electrodes (5 nm Ti/50 nm Al) for the shift register, shutter, and guard were patterned on a glass substrate by photolithography and coated with 50 nm ALD $Al_2O_3$ (masking contact pad areas using a gel strip). Next, the Ag anode and subsequent layers were deposited by VTE through a shadow mask. Then $MoO_x$ and HJ layers were patterned into four squares over the anode, aligned with every third shift register electrode. Next, a bottom buffer of 20 nm TPBi/5 nm BPhen was deposited covering the periphery of the heterojunction and the shift register. The 20 nm thick $C_{60}$ channel and 5 nm BPhen/3 nm TPBi top buffer layers were deposited, slightly underfilling the shift register and covering the HJs, with 1 mm wide interconnects between each HJ and the shift register area. The Ag cathode was deposited over the channel and top buffer layers where they extend past the guard electrode. Mask dimensions are given in FIG. 9. With reference to FIG. 9, all units are in mm. Mask patterns are shown sequentially from left to right: First the insulated electrodes are patterned by photolithography and coated with $Al_2O_3$. The anode (gold hashed area, left) is patterned via deposition through a shadow mask. All subsequent areas are also patterned by shadow mask. First, the HJ, then bottom buffer, channel and top buffer, and finally the cathode.

Example #2—Device Characterization

The ITO anode and Ag cathode were connected to a current amplifier (Keithley 428) with gain settings of $10^6$-$10^7$ V/A and 30 µs filters, and the output measured using a Tektronix 2024 oscilloscope. The guard electrode was switched between ground and negative potentials using a USB controlled relay module. A 1.5±0.1 ms RC time low-pass filter was used at the output of the relay to avoid saturating the amplifier when switching. A diode laser (637 nm, Thorlabs) was focused on the HJ where it overlaps the ITO. Measurements of transient current versus guard voltage were carried out in the dark following the sequence: ground the guard potential for 400 ms, then bias $V_{guard}$ to a value in the range −12 V-0 V, followed by a 2 s delay. Following the delay, a laser pulse (wavelength=637 nm, 200 µs pulsewidth, 360±40 nJ) illuminated the HJ through a mask to avoid stray light absorption, and the transient photocurrent measured. For charge storage experiments, the procedure was the same except that $V_{guard}$ was returned to ground $t_D$ after the laser pulse. This was repeated for each bias condition, omitting the laser pulse for comparison.

Figure 10:
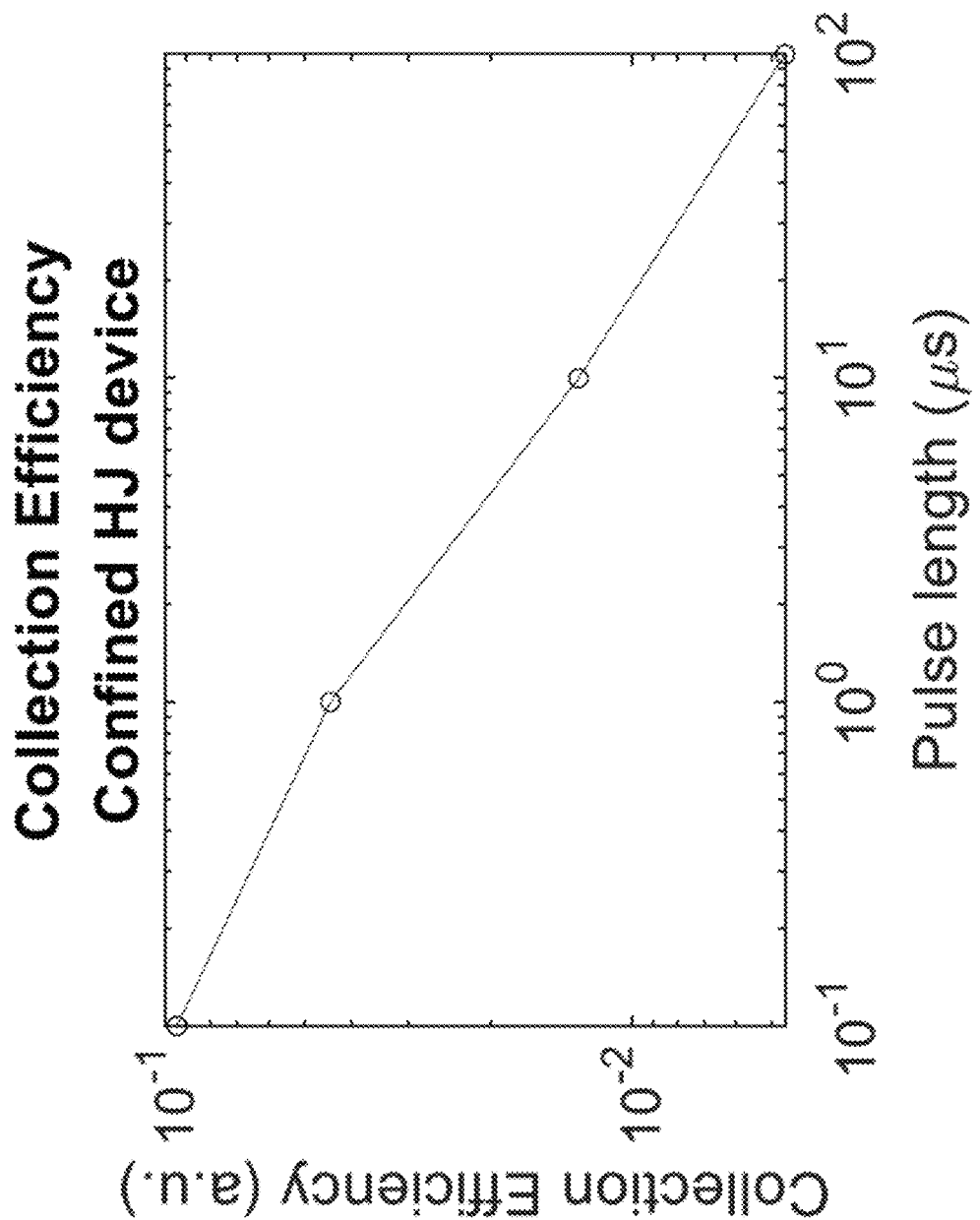
FIG. 10 is a graph of charge collection efficiency vs. pulse length.

Shift register, guard, and shutter electrodes were contacted using a probe card with spring loaded contacts. The anode and cathode were again connected to the current amplifier using the same settings as for the lateral charge confinement device. Guard, shutter, and shift register phase potentials were switched using individual computer-controlled relay switches. The shutter exposure voltage was determined by continuously clocking the shift register in the dark while reducing $V_{shutter}$ from a large negative voltage until a measurable amount of leaked charge is detected. The background charge readout measurement was carried out in the dark with the sequence: $\Phi_2 \rightarrow -10V$, 200 ms delay, $\Phi_3 \rightarrow -10V$, 200 ms delay, $V_{guard} \rightarrow -10V$, 200 ms delay, and then $V_{shutter} \rightarrow -10V$. After a 1.5 s delay, the shift register was read out by a sequence of eight clock cycles (one cycle advances charge by one pixel). The clock sequence was $\Phi_3 \rightarrow 0V$, 300 ms delay, $\Phi_1 \rightarrow -10V$, 300 ms delay, $\Phi_2 \rightarrow 0V$, 300 ms delay, $\Phi_3 \rightarrow -10V$, 300 ms delay, $\Phi_1 \rightarrow 0V$, 300 ms delay, $\Phi_2 \rightarrow -10V$, 300 ms delay. For the photogenerated charge packet measurement, the process was repeated with the bias voltage increased to −12 V, then the HJ junction was illuminated by a laser pulse (wavelength=637 nm, 2 s pulsewidth, 30±3 mJ) through a mask to avoid stray light exposure. One second after illumination began, $V_{shutter}$ was reduced to −9.6 V for 1 s and then switched back to −12V. The shift register was then read out with another sequence of eight clock cycles. The signal-to-noise ratio for this measurement was 7±3. Since the collected signal of the lateral transport devices rolls off with the intensity following $\propto I^{0.43}$ (see FIG. 10), the minimum detectable signal was expected to be approximately 0.3 mJ using the same exposure settings. With reference to FIG. 10, a graph of charge collection efficiency versus pulse length is shown. The charge collection efficiency is calculated as the number of collected charges divided by the number of incident photons, without blocking potentials applied to the guard electrode. The efficiency rolls off with increasing pulse length due to increased recombination as more light is incident on the heterojunction, because charges are generated faster than they can be extracted laterally through the channel.

Example #2—Results

Figure 11B:
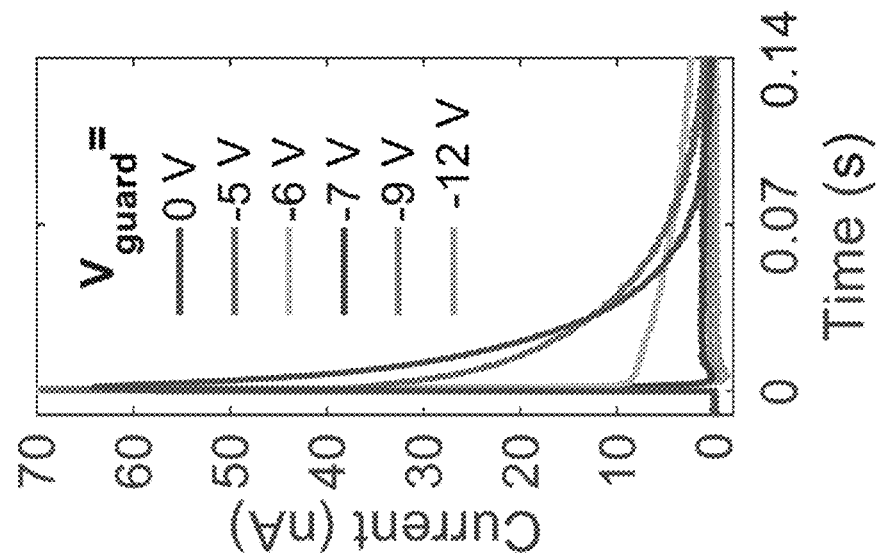
FIG. 11B is a graph of transient photocurrent collected between the anode and cathode with different guard electrode voltages.
Figure 11A:
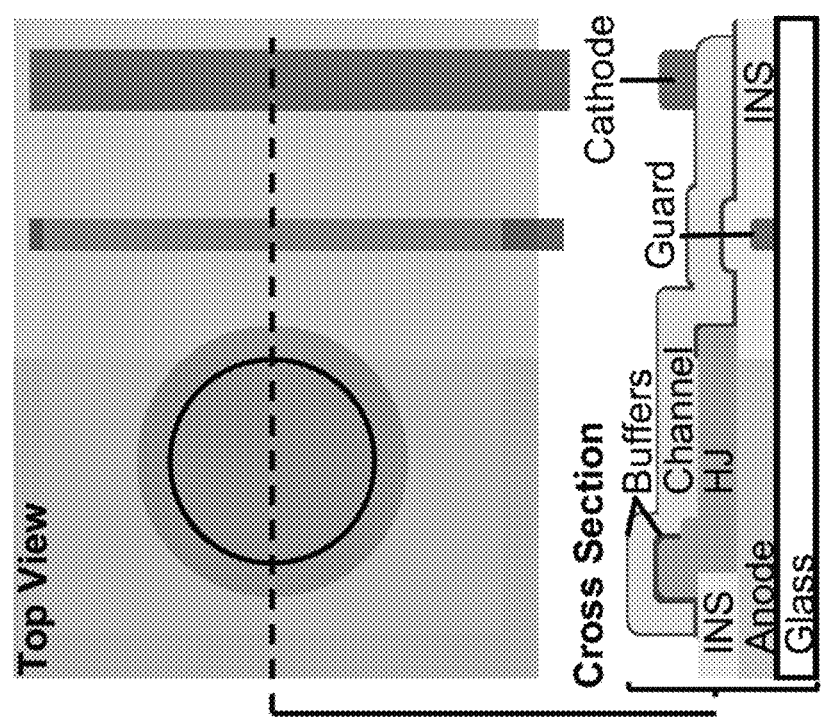
FIG. 11A shows top and cross-sectional schematic views of a single-pixel device structure.

Single pixel devices, shown schematically in FIG. 11A in top and cross-sectional views, were fabricated to test the ability to confine, and subsequently release photogenerated charge packets using a bias applied to the guard electrode. As with previously reported devices having a similar organic layer structure, charges were generated at the 1:1 2-((7-(4-(dip-tolylamino)phenyl)benzo[c][1,2,5]thiadiazol-4-yl) methylene)malononitrile (DTDCPB): $C_{70}$ heterojunction (HJ) when illuminated, with holes collected at the anode. The photogenerated electrons were energetically confined to the $C_{60}$ channel by the offset between the lowest unoccupied molecular orbitals of neat $C_{60}$, and $C_{70}$ blended with the highly dipolar DTDCPB. The confined electrons laterally diffused to the Ag cathode, which was connected to a transimpedance amplifier and subsequently detected by an oscilloscope. The efficiency of lateral charge collection decreased with the light intensity on the HJ. This was due to increased recombination in the HJ when the charge generation rate exceeded the collection rate, saturating the channel lying above the generation area, see FIG. 10. FIG. 11B shows photocurrent transients stimulated by a laser pulse at t=0 as a function of guard electrode bias. As the guard voltage was changed from $V_{guard}$=0 to −12 V, the current transient was blocked from reaching the cathode.

Figure 12:
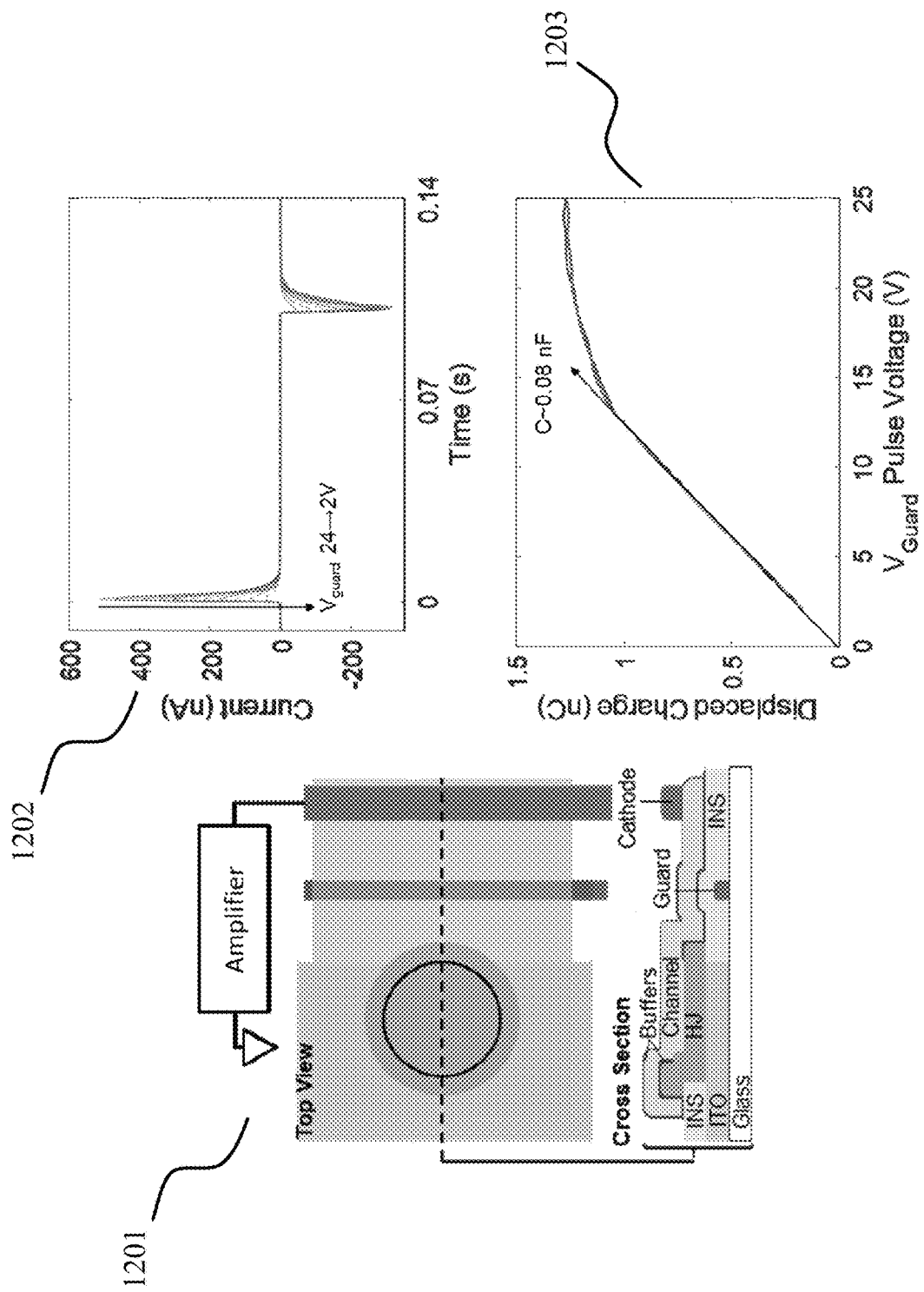
FIG. 12 shows a device schematic and detection circuit, and graphs of displaced background charge signal and total displaced charge versus $V_{guard}$.

Two key observations were made. First, the guard potential required to block electrons (6-10 V) is much higher than would be needed to block electron diffusion if the organic channel contained a negligible amount of free background charge. In the absence of free charge, the electric potential in the channel above the guard approximately equals $V_{guard}$, because of the proximity of the electrode to the channel relative to other fixed potentials. Blocking was expected at $V_{guard} \lesssim -1$ V, which is the maximum expected in the channel based on the open circuit voltage of organic photovoltaic devices using the same HJ materials. Large displacement current transients due to the capacitance between the channel and guard electrode were measured when switching $V_{guard}$. These transients saturated with the onset of charge blocking. They are due to background mobile charge in the channel, as shown in FIG. 12. With reference to FIG. 12, 1201 shows a device schematic and detection circuit. 1202 shows a graph of a displaced background charge signal, and 1203 shows a graph of the total displaced charge versus $V_{guard}$. The amount of charge displaced rolls off with the onset of photocurrent blocking, which for this sample occurred between 12-14 V.

Figure 13:
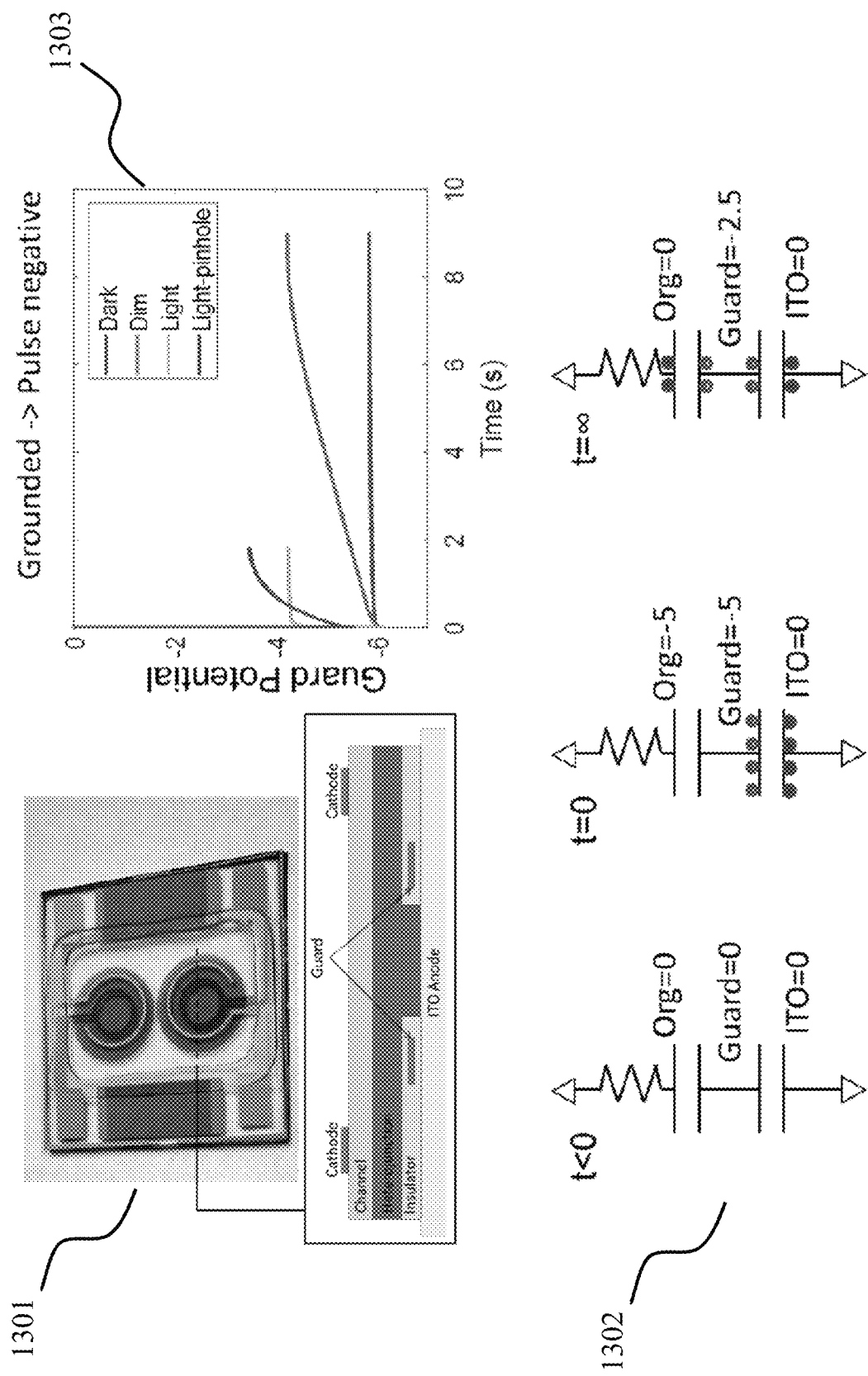
FIG. 13 shows a cross-sectional schematic of a modified single pixel device, a graph of transient guard voltage over time, and a diagram of an equivalent circuit model.

Integrating the displaced charge when switching $V_{guard}$ from 0 to −7 V gives 2±1 nC, corresponding to a background charge density of $1.2 \pm 0.6 \times 10^{12}$ $cm^{-2}$ if the area above the electrode was fully depleted under bias. Second, the measurement should be taken promptly after switching to $V_{guard}$<0 V. This potential attracted positive charge that accumulated at the organic-insulator interface, shielding the $C_{60}$ channel from the guard potential, see FIG. 13. With reference to FIG. 13, 1301 is a photograph and cross-sectional schematic of a modified single pixel device. Here, the guard electrode forms a ring surrounding the exposed ITO area, and is insulated on the top and bottom by 50 nm ALD $Al_2O_3$ layers. The $MoO_x$/HJ layers were deposited through the same mask as the channel, and the top Ag cathode forms a partial ring enclosing the guard electrode. The HJ, buffer, and channel layer compositions are unchanged from those described above. 1303 is a graph of transient guard voltage. The guard electrode was left floating, with its voltage measured using a high impedance buffer amplifier (>1 TΩ). At t=0 the guard voltage was briefly (<20 ms contact time) set to −6V. This was carried out in the dark, at two different ambient light levels, and in the light with a mask that confined exposure to the center of the guard ring. The potential on the guard ring relaxes to roughly half its initial value on a timescale determined by the light level and exposure area.

1302 in FIG. 13 shows an equivalent circuit model. These dynamics can be explained using the depicted equivalent circuit. The guard electrode capacitance is composed of two parts, the capacitance across the bottom oxide to the ITO and across the top oxide to the organic channel. Before t=0 the guard is uncharged. When the guard is set to −6V at t=0, the capacitor formed with the ITO is fully charged while the organic channel remains nearly uncharged because of the large impedance between the grounded cathode and the guard. Then, positive charge in the channel collects over the guard, and the guard potential relaxes to approximately 3V. Light exposure generates free charges in the HJ, and increases the rate of positive charge accumulation, indicated by the faster change in guard voltage at higher light levels. When illuminating only the exposed ITO area, less charge accumulates in the organics during the brief contact with the −6V potential, causing the final voltage to be closer to −3V than for the unmasked measurements. Subsequent experiments confirmed that confining the HJ such that it does not overlap the guard electrode reduces the rate of photogenerated positive charge accumulation to negligible levels on the time scale of the OCCD readout measurements (<20 s).

If the HJ overlaps the guard electrode, photogenerated positive charge can rapidly accumulate, shielding the channel from the guard potential. Biasing the electrode in the dark or patterning the HJ so that it does not overlap with the guard electrode increases the time required to accumulate positive charge.

To determine if photogenerated charges were stored or recombine when blocked, the difference between current transients was measured with and without a laser pulse. Here, $V_{guard}$ swung from 0 V to −7 V, and the resulting current transient from displaced background charge was allowed to dissipate. A pulse of light then illuminated the HJ at t=0, and $V_{guard}$ was returned to 0 V after a delay, $t_D$. The difference between current in the presence or absence of the pulsed illumination is shown in FIG. 14A, with individual light and dark transients shown in FIG. 14B.

Figure 14A:
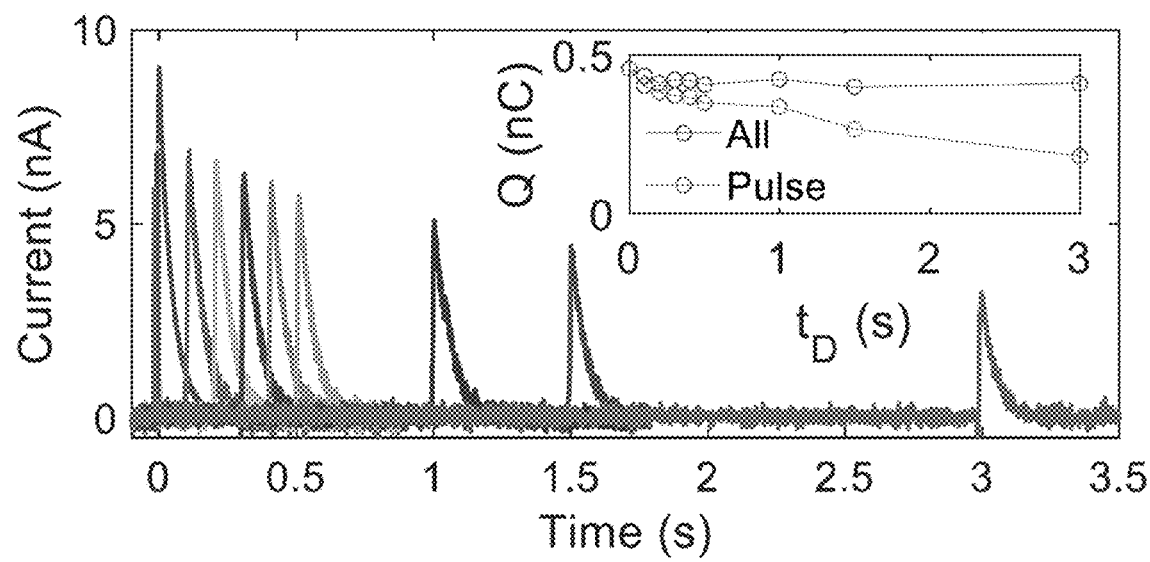
FIG. 14A is a graph of transient photocurrent for different storage times.

With reference to FIG. 14A, the guard electrode was biased to −7 V prior to the measurement and was switched to 0 V after a delay, $t_D$, releasing charge generated by a laser pulse at t=0. Current is plotted as the difference between light and dark transients. The inset of FIG. 14A shows the collected charge, Q, vs storage time, integrated over the full transients or locally about the pulse, i.e., from t=$t_D$ to t=$t_D$+300 ms, are denoted as "all" and "pulse", respectively.

Figure 14B:
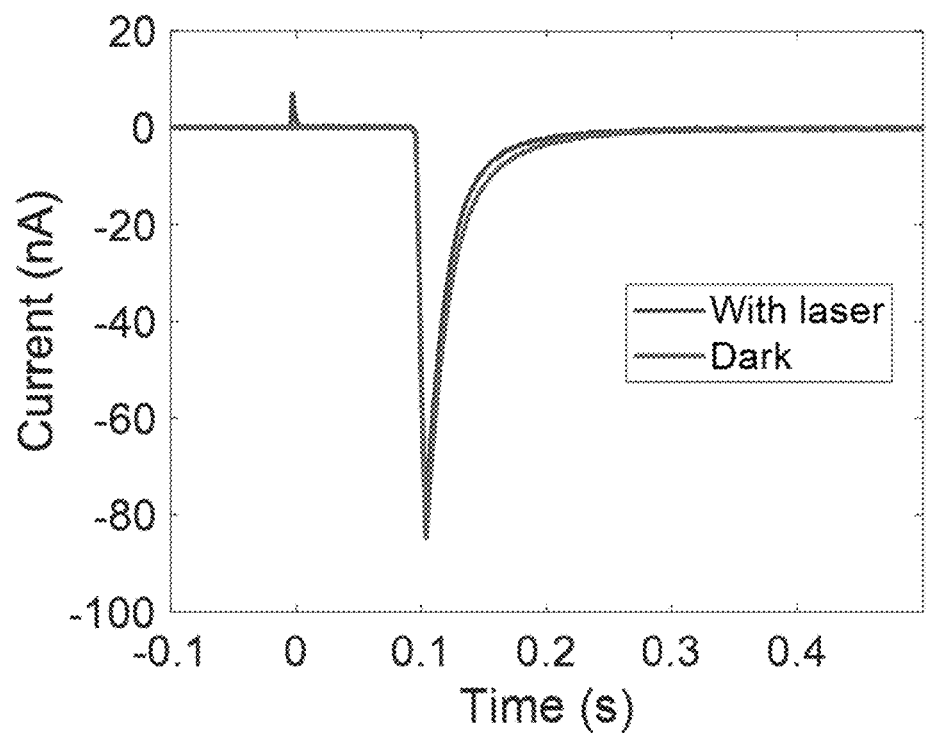
FIG. 14B is a graph of measured transient current.

With reference to FIG. 14B, a graph of the measured transient current is shown. The guard electrode of the single pixel charge confinement device was initially biased to $V_{guard}$=−7 V. Data is shown both in the dark and for a laser pulse focused onto the heterojunction at t=0. At t=1 s, $V_{guard}$ is switched to 0 V. A large current pulse was observed as background charge flowed back into the channel over the guard electrode. When the laser pulse was used, stored charge reduced the amount of charge injected back into the channel from the cathode.

Photogenerated transient current pulses were visible even for $t_D$=3 s, where the peak intensity decreased with increasing charge storage time. Integrating the collected charge, Q, (see FIG. 14A, inset) for the full transient shows that Q was relatively unchanged up to 3 s. The magnitude of the pulse was reduced by charge leakage across the guard electrode rather than recombination, which can be avoided by applying a larger guard bias.

Figure 15A:
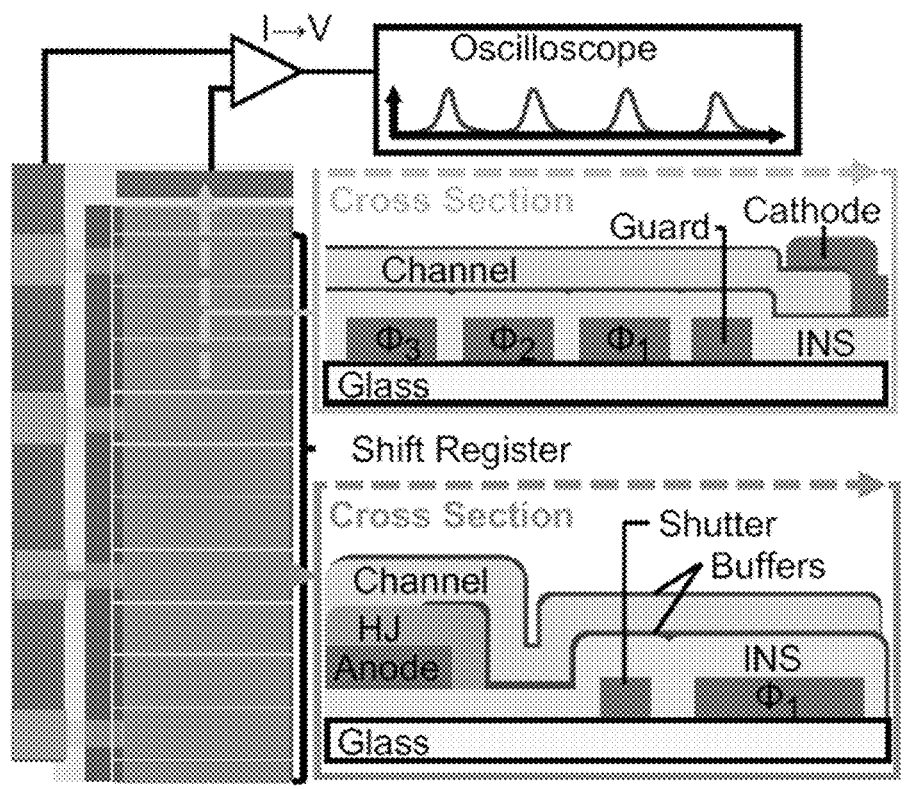
FIG. 15A is a structural diagram of an OCCD device.

The four-pixel OCCD is shown schematically in FIG. 15A. FIG. 15A shows top and cross-sectional schematic views of the OCCD and the measurement circuit. The guard, shutter, and $\Phi_3$ have a single contact pad each, while $\Phi_1$ and $\Phi_2$ electrodes have multiple pads that are connected externally.

Figure 15B:
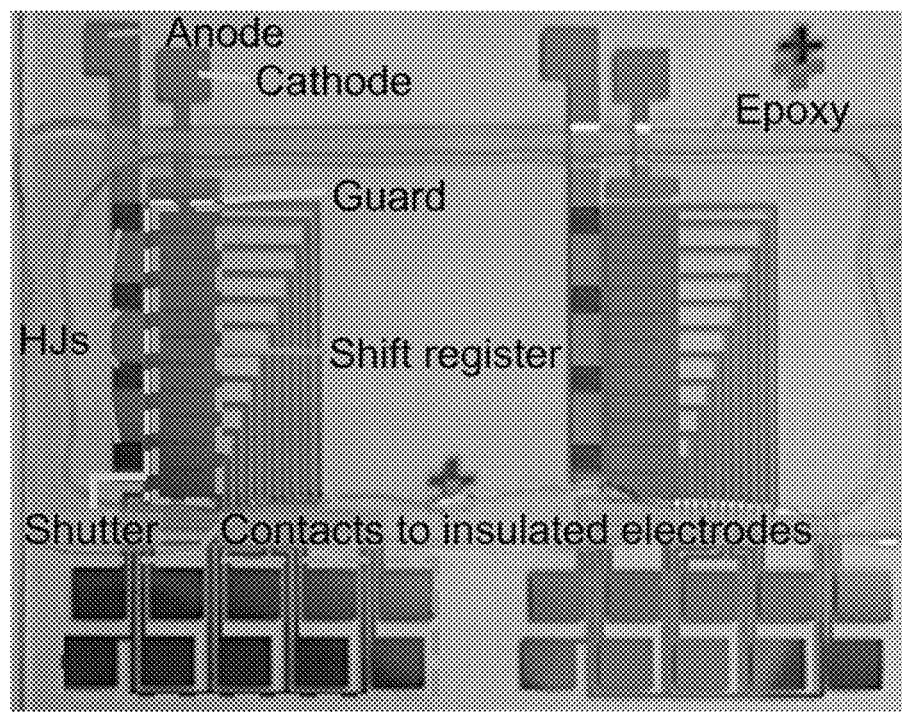
FIG. 15B is a photograph of a prototype OCCD device.

Thirteen metal electrodes were photolithographically patterned on a glass substrate and coated with 50 nm $Al_2O_3$: 11 electrodes separated by 50 μm defined the shift register, and one each formed the guard and shutter electrodes. An Ag anode runs parallel to the shutter electrode on the side opposite the shift register. Four HJ regions were deposited on the anode, each connected to the nearest shift register electrode by a 20 nm thick $C_{60}$ channel. Inside the shift register, the channel ran in a vertical stripe that extended past the guard electrode and terminated under the Ag cathode. The three shift register phases are denoted $\Phi_1$-$\Phi_3$. The electrode nearest the guard electrode is $\Phi_1$, followed by $\Phi_2$, $\Phi_3$, $\Phi_1$, etc. (see FIG. 15A). A photograph of the device is shown in FIG. 15B. As shown in the photograph in FIG. 15B, two imagers were patterned side by side on one substrate. Also visible in the photograph are the contact pads and traces, alignment marks, and encapsulation cover slide attached to the substrate using UV cured epoxy.

Figure 16A:
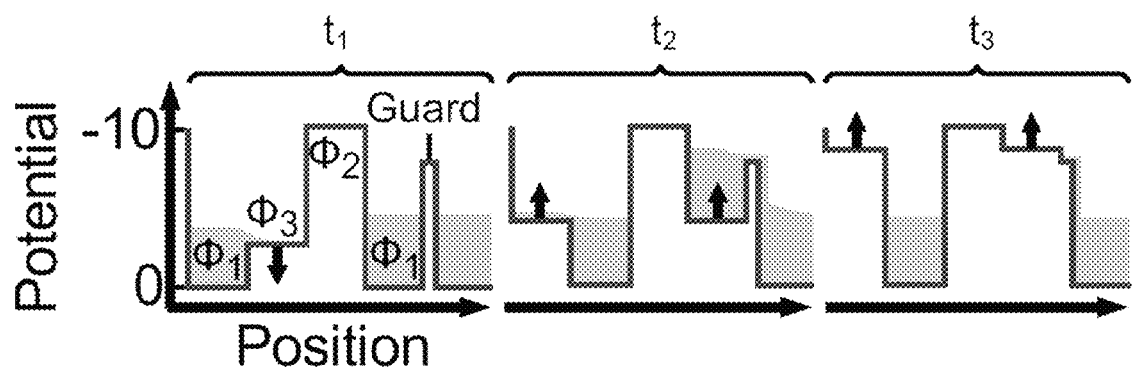
FIG. 16A is a schematic diagram of a potential sequence for electrodes at the end of the shift register.

Photocurrent was collected between the anode and cathode in response to illumination of the HJ without biasing the electrodes. This current may be cut off by biasing any one of the shutter, guard, or $\Phi_1$ electrodes (at <−8V), since they completely bisected the channel connecting the HJs to the cathode. Charge coupled transport was demonstrated by first biasing $\Phi_2$, $\Phi_3$, and shutter electrodes to −10 V, and $V_{guard}$=−8.75 V. This expelled charge from the channel above the biased electrodes, leaving background charge packets confined above $\Phi_1$. The shift register was clocked using a three-phase scheme shown in FIG. 16B, advancing the charge packets toward the cathode. The first few steps of this process are shown schematically in FIG. 16A. FIG. 16A depicts sequential "snapshots" of the of the electrode potentials shown at times $t_1$-$t_3$. High potentials repel the electron charge packets, indicated as shaded areas. Because $V_{guard}$>−10 V, charges diffused toward the cathode when expelled from above the adjacent $\Phi_1$ electrode, preventing charge from flowing back into the shift register.

Figure 16B:
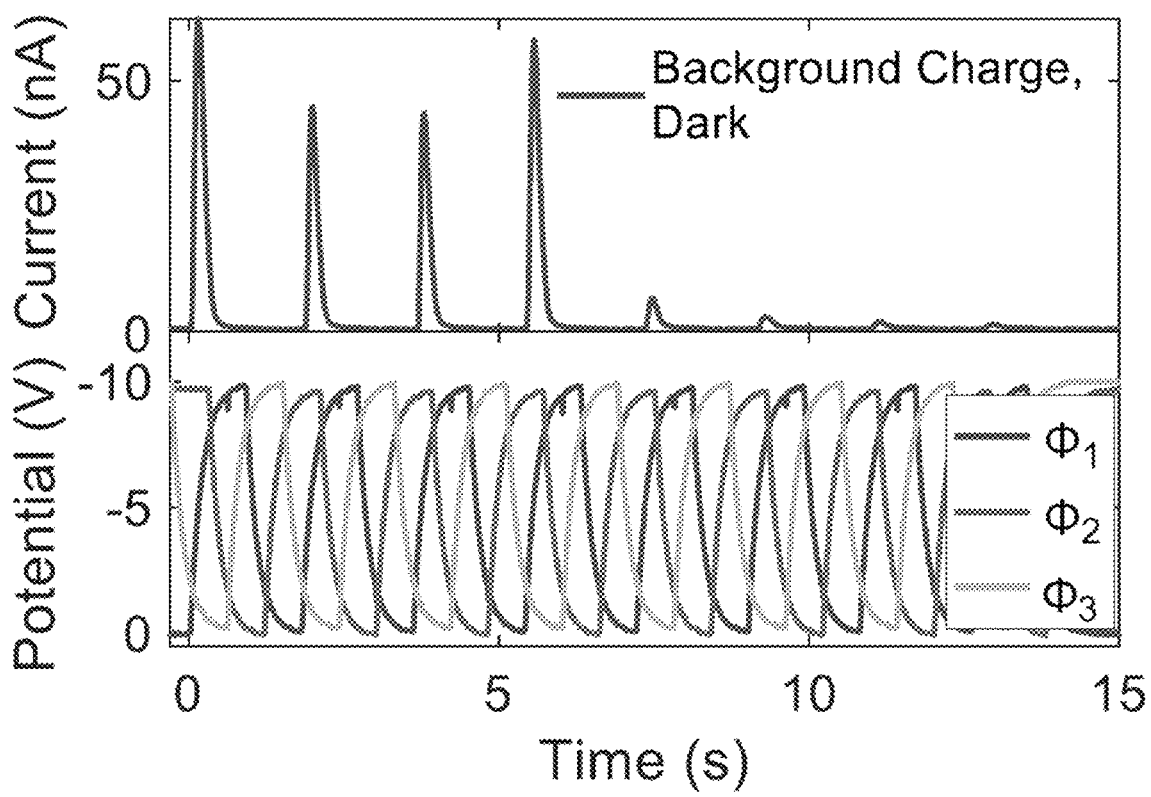
FIG. 16B is a graph of measured signal from expulsion of background charge and a graph of voltage vs time for electrodes $\Phi_1$-$\Phi_3$ during the measurement.

The current measured during this procedure and the electrode potentials vs time are shown in the top graph of FIG. 16B. Current pulses were measured when $\Phi_1$ swung negative with each subsequent clock cycle. The first four pulses reached >43 nA peak current compared to <7 nA for subsequent pulses, which decreased with continued clocking. If $V_{guard}$=0V while clocking, negative current pulses were observed each time $\Phi_1$ was switched to ground, drawing background charge into the shift register. Similarly, if the shutter potential $V_{shutter}$=0 V, pulses following the fourth clock cycle did not decrease because charge packets were replenished through the channels connecting the HJs and $\Phi_1$.

Figure 16C:
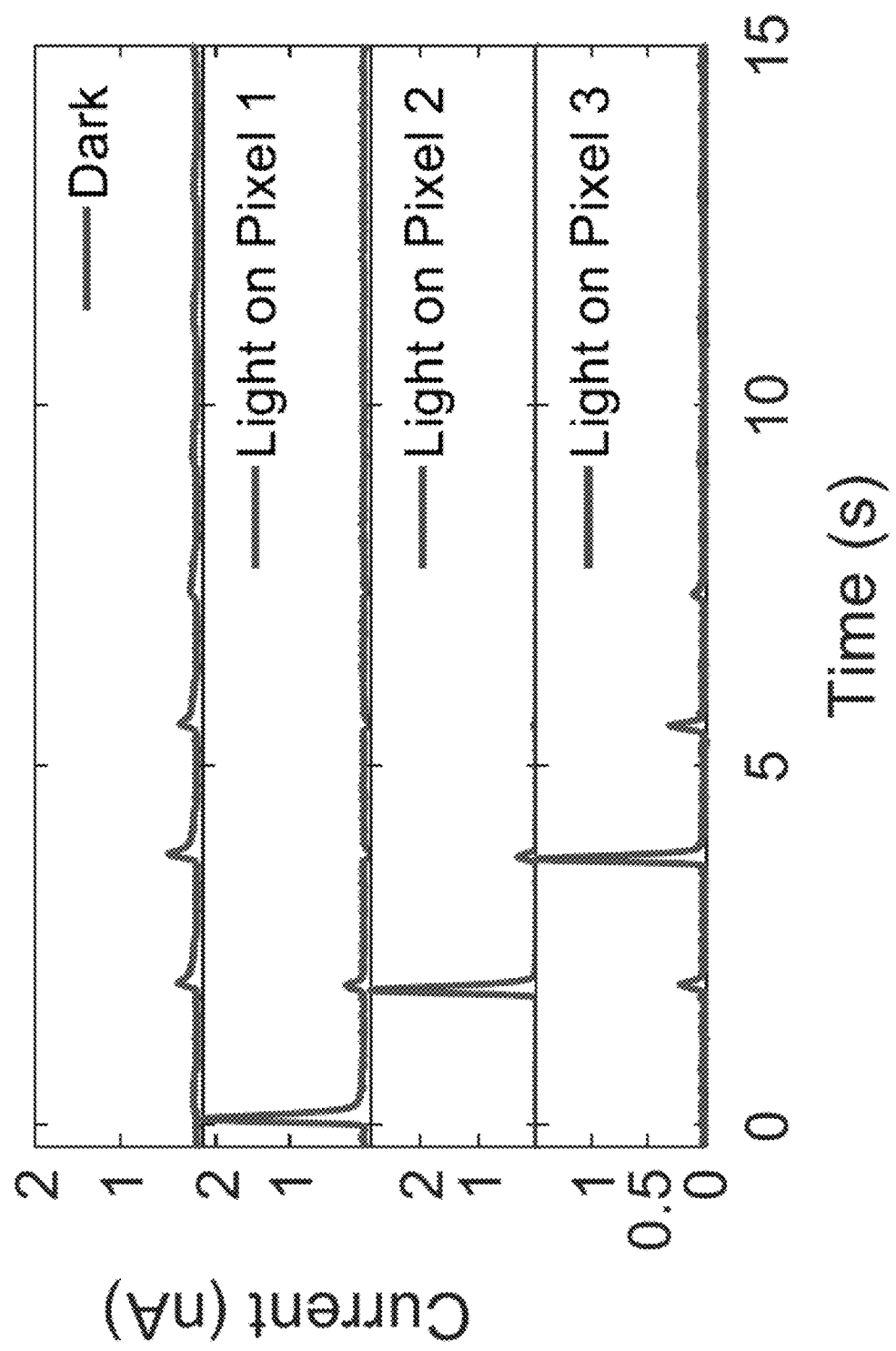
FIG. 16C is a graph of measured signal for dark and single pixel illumination exposures.

The photogenerated charge measurement began by expelling background charge as explained above, then pausing for exposure with $\Phi_1$=0 V and $\Phi_2$, $\Phi_3$=−12 V. Next, $V_{shutter}$ swung to −9.6V, which was sufficient to block background charge from leaking into the shift register during a single clock cycle in the dark. Then, one HJ was illuminated with a λ=637 nm wavelength laser, generating charges and raising the potential of electrons in the channel. This increased the rate of electrons leaking from the illuminated HJ over the shutter. Following exposure, $V_{shutter}$ was switched back to −12 V and the shift register was emptied by a series of eight clock cycles. FIG. 16C shows the measured current in the dark and with illumination focused onto one pixel per measurement, resulting in a distinct current pulse observed at a time delay corresponding to the illuminated pixel.

Using majority carrier electrons to store information represents a significant difference from conventional CCD architectures that transfer minority carriers. Using majority carriers precludes using attractive potentials (positive electrode bias, in the case of electrons) to confine charge packets because no depletion region would form. Additionally, the shift register and photoactive regions were spatially separated, because extracting photogenerated holes from the HJ requires circuit connectivity that prevents depletion. This scheme is general and is also applicable to inorganic devices. Conventional CCD architectures are also suitable for OCCDs provided they use long-range lateral diffusion structures for minority carriers or charge depleted channels.

Vacuum deposited films of pre-purified $C_{60}$ have been reported to be weakly n-type, with background charge densities ranging from $10^7$-$10^{11}$ $cm^{-3}$ and estimated donor densities of $10^{14}$ $cm^{-3}$. The charge density measured here corresponds to $4\pm2\times10^{17}$ $cm^{-3}$ if the background charge is confined within the channel, and likely includes effects from unintentional bulk or interface doping. Blocking via repulsive potentials is achieved once the channel above the electrode is depleted of background charge. Reducing the background charge density, for example by further purification of the materials, is therefore expected to reduce the voltage required to block the lateral current. The minimum blocking voltage may be limited by energetic disorder leading to tail states in the distribution of transport sites, which likely plays a role in the charge leakage over the blocking potentials, as shown in FIG. 14A The four large current pulses in FIG. 16B correspond to the four charge packets over the $\Phi_1$ electrodes. The small subsequent pulses are due to residual background charges in the regions between electrodes as well as imperfect transfer of the photogenerated charge. These parasitic signal pulses can be reduced, thereby improving the signal-to-noise ratio, by overlapping the electrodes to eliminate the intervening spaces, and by optimization of the phase potential waveforms. Variations in the magnitude of the first four pulses is likely a result of nonuniformities in fabrication, the transfer process at the first and last pixel, and the phase waveforms. The reduction in pulse magnitude after the fourth pulse confirms charge-coupled transport. The signal measured for the optically generated charge packets in FIG. 16C can be increased by tuning the shutter voltage. The signal strength is also expected to be greater in a minority carrier device that does not require shutter electrode bias during exposure.

The transfer rate between adjacent electrodes is approximated from the solution to the drift-diffusion equation:

$$\dot{n}(x, t) = D\nabla^2 n(x, t) - \mu F_x \nabla n(x, t) \qquad \text{Equation 1}$$

subject to boundary conditions $$\delta_x n(L, t) = \mu F_x n(L, t) \qquad \text{Equation 2}$$

and $$n(0, t) = 0 \qquad \text{Equation 3}$$

which correspond to perfect charge blocking and extraction, respectively. Here, n is the charge density, $D=0.5$ cm$^2$ s$^{-1}$ is the electron diffusivity and $\mu=19$ cm$^2$/v-s the mobility (obtained from the Einstein relation at room temperature), and L is the pixel width. Also, $F_x$ is the lateral electric field in the channel that is assumed to be constant for simplicity, i.e. neglecting self-repulsion and the spatial dependence of fringe fields. The time required for 99.99% charge transfer between adjacent electrodes, $t_{CT}$, is calculated as a function of electric field, with results shown in FIG. 17. The readout time for a N×N matrix of pixels (N>>1) using a three-phase clock scheme is $t_{RO} \approx t_{CT}(3 \times N)^2/N_{amp}$, where $N_{amp}$ is the number of readout amplifiers. In the diffusion limit, a 500×500 sensor with $N_{amp}=4$ requires 6-7 μm diameter pixels to achieve $t_{RO}<1$ s, while 10 μm pixels and $N_{amp}=500$ (1 per column) yields $t_{RO}<20$ ms. Introducing drift transport significantly decreases $t_{RO}$, for example by applying fringing fields as shown in FIG. 17, inset. This analysis neglects charges trapped at defects or in the tail of the transport density of states, which may reduce the charge transfer speed and collection efficiency.

Despite the inherently lower charge mobility in organic compared to inorganic semiconductors, OCCDs have the advantage of being potentially less difficult to manufacture in flexible, ultralight, and large area form factors, which could potentially be of use in simplifying complex optical systems. Organic CCDs may be especially compelling for space applications, where their low weight, low sensitivity to cosmic radiation, and reduced requirements for encapsulation are advantageous. They can function as an element in ultralight optical imaging systems when used with thin film Fresnel lenses, or as lightweight memory devices. Additionally, stacked, semi-transparent OCCDs with individual pixel triads absorbing in different spectral regions could have a nearly 100% pixel fill factor in each color and generate color images without color filters.

Conclusion

Demonstrated herein is a charge coupled device comprising an organic semiconductor thin film deposited on a series of closely spaced, insulated electrodes. Charge coupled transport was demonstrated for both thermally and photo-generated charge packets. The packets were confined using repulsive potentials, which contrasts with conventional inorganic semiconductor CCDs that transport minority carriers using a staircase of attractive potentials. The present disclosure demonstrates the versatility of organic semiconductors and paves the way for further development of high performance OCCDs. These may find use is imaging applications where their flexible, ultralight form factors and other attributes of organic semiconductors (e.g. radiation hardness) are required.

References

The following publications are incorporated herein by reference:

Boyle, W. S.; Smith, G. E., Charge Coupled Semiconductor Devices. *AT&T Tech J* 1970, 49, 587-593.

Amelio, G. F.; Tompsett, M. F.; Smith, G. E., Experimental Verification of Charge Coupled Device Concept. *AT&T Tech J* 1970, 49, 593.

Janesick, J. R.; Elliott, T.; Collins, S.; Blouke, M. M.; Freeman, J., Scientific Charge-Coupled-Devices. *Opt Eng* 1987, 26, 692-714.

Tiffenberg, J.; Sofo-Haro, M.; Drlica-Wagner, A.; Essig, R.; Guardincerri, Y.; Holland, S.; Volansky, T.; Yu, T. T., Single-Electron and Single-Photon Sensitivity with a Silicon Skipper CCD. *Phys Rev Lett* 2017, 119.

Baumann, A.; Lorrmann, J.; Rauh, D.; Deibel, C.; Dyakonov, V., A New Approach for Probing the Mobility and Lifetime of Photogenerated Charge Carriers in Organic Solar Cells Under Real Operating Conditions. *Adv Mater* 2012, 24, 4381-4386.

Deledalle, F.; Tuladhar, P. S.; Nelson, J.; Durrant, J. R.; Kirchartz, T., Understanding the Apparent Charge Density Dependence of Mobility and Lifetime in Organic Bulk Heterojunction Solar Cells. *J Phys Chem C* 2014, 118, 8837-8842.

Street, R. A.; Schoendorf, M., Interface state recombination in organic solar cells. *Phys Rev B* 2010, 81.

Burlingame, Q.; Coburn, C.; Che, X. Z.; Panda, A.; Qu, Y.; Forrest, S. R., Centimetre-scale electron diffusion in photoactive organic heterostructures. *Nature* 2018, 554, 77-80.

Chen, Y. H.; Lin, L. Y.; Lu, C. W.; Lin, F.; Huang, Z. Y.; Lin, H. W.; Wang, P. H.; Liu, Y. H.; Wong, K. T.; Wen, J. G.; Miller, D. J.; Darling, S. B., Vacuum-Deposited Small-Molecule Organic Solar Cells with High Power Conversion Efficiencies by Judicious Molecular Design and Device Optimization. *J Am Chem Soc* 2012, 134, 13616-13623.

Ishii, H.; Hayashi, N.; Ito, E.; Washizu, Y.; Sugi, K.; Kimura, Y.; Niwano, M.; Ouchi, O.; Seki, K., Kelvin Probe Study of Band Bending at Organic Semiconductor/Metal Interfaces: Examination of Fermi Level Alignment. *Physics of Organic Semiconductors* 2006, 69-94.

Kang, S. J.; Yi, Y.; Kim, C. Y.; Cho, S. W.; Noh, M.; Jeong, K.; Whang, C. N., Energy level diagrams of $C_{60}$/pentacene/Au and pentacene/$C_{60}$/Au. *Synthetic Metals* 2006, 156, 32-37.

Tanaka, Y.; Kanai, K.; Ouchi, Y.; Seki, K., Oxygen effect on the interfacial electronic structure of $C_{60}$ film studied by ultraviolet photoelectron spectroscopy. *Chemical Physics Letters* 2007, 441, 63-67.

Irfan; Zhang, M. L.; Ding, H. J.; Tang, C. W.; Gao, Y. L., Strong interface p-doping and band bending in $C_{60}$ on $MoO_x$. *Organic Electronics* 2011, 12, 1588-1593.

Veenstra, S. C.; Heeres, A.; Hadziioannou, G.; Sawatzky, G. A.; Jonkman, H. T., On interface dipole layers between $C_{60}$ and Ag or Au. *Applied Physics a-Materials Science & Processing* 2002, 75, 661-666.

Carnes, J. E.; Kosonocky, W. F.; Ramberg, E. G., Drift-Aiding Fringing Fields in Charge-Coupled Devices. *IEEE Journal of Solid-State Circuits* 1971, Sc 6, 322-326.

Cardinaletti, I.; Vangerven, T.; Nagels, S.; Cornelissen, R.; Schreurs, D.; Hruby, J.; Vodnik, J.; Devisscher, D.; Kesters, J.; D'Haen, J.; Franquet, A.; Spampinato, V.; Conard, T.; Maes, W.; Deferme, W.; Manca, J. V., Organic and perovskite solar cells for space applications. *Solar Energy Materials and Solar Cells* 2018, 182, 121-127.

Schreurs, D.; Nagels, S.; Cardinaletti, I.; Vangerven, T.; Cornelissen, R.; Vodnik, J.; Hruby, J.; Deferme, W.; Manca, J. V., Methodology of the first combined in-flight and ex situ stability assessment of organic-based solar cells for space applications. *Journal of Materials Research* 2018, 33, 1841-1852.

Kumar, A.; Devine, R.; Mayberry, C.; Lei, B.; Li, G.; Yang, Y., Origin of Radiation-Induced Degradation in Polymer Solar Cells. *Advanced Functional Materials* 2010, 20, 2729-2736.

Paterno, G. M.; Robbiano, V.; Fraser, K. J.; Frost, C.; Sakai, V. G.; Cacialli, F., Neutron Radiation Tolerance of Two Benchmark Thiophene-Based Conjugated Polymers: the Importance of Crystallinity for Organic Avionics. *Scientific Reports* 2017, 7.

O'Neill, M. J.; Piszczor, M. F.; Eskenazi, M. I.; McDanal, A. J.; George, P. J.; Botke, M. M.; Brandhorst, H. W.; Edwards, D. L.; Hoppe, D. T., Ultra-light stretched Fresnel lens solar concentrator for space power applications. *Proc. SPIE 5179, Optical Materials and Structures Technologies* 2003, 5179, 116-126.

Armin, A.; Jansen-van Vuuren, R. D.; Kopidakis, N.; Burn, P. L.; Meredith, P., Narrowband light detection via internal quantum efficiency manipulation of organic photodiodes. *Nat Commun* 2015, 6.

Dillon, P. L. P.; Lewis, D. M.; Kaspar, F. G., Color Imaging-System Using a Single CCD Area Array. *IEEE J. Solid-State Circuits* 1978, 13, 28-33.

Takada, S.; Ihama, M.; Inuiya, M., CMOS image sensor with organic photoconductive layer having narrow absorption band and proposal of stack type solid-state image sensors. *Proc SPIE* 2006, 6068.

Coburn, C; Fan, D; Forrest, S. R., Organic Charge-Coupled Device. *ACS Photonics* 2019 6 (8), 2090-2095

The disclosures of each and every patent, patent application, and publication cited herein are hereby incorporated herein by reference in their entirety. While this invention has been disclosed with reference to specific embodiments, it is apparent that other embodiments and variations of this invention may be devised by others skilled in the art without departing from the true spirit and scope of the invention. The appended claims are intended to be construed to include all such embodiments and equivalent variations.

What is claimed is:

1. An organic optoelectronic device, comprising:
a substrate having first and second regions exclusive of one another;
a charge injection element positioned over only the first region of the substrate;
a shutter electrode positioned only over the second region of the substrate;
an insulator layer positioned over at least a portion of the shutter electrode;
an organic channel layer, comprising an organic channel material, positioned over at least a portion of the insulator layer and at least a portion of the charge injection element; and
a first electrode positioned over the channel layer only in the second region of the substrate;
wherein the organic channel layer forms a lateral charge transport path parallel to the substrate, running from the charge injection element to the first electrode; and
wherein the shutter electrode is configured to generate a repulsive potential barrier in the channel layer, suitable to at least reduce movement of charge along the lateral charge transport path in the channel layer.

2. The organic optoelectronic device of claim 1, wherein the charge injection element comprises:
a second electrode; and
an organic heterojunction layer comprising an organic heterojunction material, positioned between at least a portion of the second electrode and at least a portion of the organic channel layer.

3. The organic optoelectronic device of claim 2, wherein the heterojunction layer and the channel layer comprise fullerene.

4. The organic optoelectronic device of claim 2, wherein the heterojunction has a diameter in a range of 1 μm to 20 μm.

5. The organic optoelectronic device of claim 2, wherein an energy barrier between the organic heterojunction material and the organic channel material is at least 300 meV.

6. The organic optoelectronic device of claim 1, further comprising a driver circuit configured to bias the shutter electrode at a first repulsive potential and a second passive potential.

7. The organic optoelectronic device of claim 1, wherein the second electrode is one terminal of a plurality of terminals of a shift register, the plurality of terminals positioned along a shift register axis, the second region of the channel layer extending along the shift register axis;
further comprising at least one guard electrode configured to create a repulsive potential barrier in the channel layer, preventing movement of charge along the shift register axis.

8. The organic optoelectronic device of claim 7, further comprising a driver circuit configured to bias the at least one guard electrode at a first repulsive potential and a second passive potential.

9. The organic optoelectronic device of claim 1, wherein the shutter electrode completely bisects the channel layer between the charge injection element and the second electrode.

10. The organic optoelectronic device of claim 1, further comprising a buffer layer positioned over at least a portion of the insulator layer and over or under at least a portion of the channel layer.

11. The organic optoelectronic device of claim 1, wherein the channel layer comprises fullerene.

12. The organic optoelectronic device of claim 1, further comprising a plurality of additional first electrodes, each first electrode configured to receive a quantity of charge from at least one charge injection element; and
a plurality of readout circuits, each connected to one of the plurality of first electrodes.

13. The organic optoelectronic device of claim 1, further comprising at least second, third, and fourth shutter electrodes positioned between the substrate and at least a portion of the insulator layer along a shift register axis, each of the second, third, and fourth shutter electrodes having an electrode length along the shift register axis;
wherein a distance between a top surface of each of the second, third, and fourth electrodes and the bottom surface of the channel layer is about equal to the electrode length.

* * * * *